(12) United States Patent
Yamashita

(10) Patent No.: US 12,310,154 B2
(45) Date of Patent: May 20, 2025

(54) LIGHT-TRANSMISSIVE MEMBER AND METHOD OF MANUFACTURING THE SAME, OPTICAL MEMBER, AND LIGHT EMITTING DEVICE

(71) Applicant: NICHIA CORPORATION, Anan (JP)

(72) Inventor: Toshiaki Yamashita, Komatsushima (JP)

(73) Assignee: NICHIA CORPORATION, Anan (JP)

(*) Notice: Subject to any disclaimer, the term of this patent is extended or adjusted under 35 U.S.C. 154(b) by 478 days.

(21) Appl. No.: 17/536,993

(22) Filed: Nov. 29, 2021

(65) Prior Publication Data
US 2022/0173280 A1    Jun. 2, 2022

(30) Foreign Application Priority Data

Nov. 30, 2020 (JP) ................... 2020-198900
Jul. 26, 2021 (JP) ................... 2021-121667

(51) Int. Cl.
*H10H 20/851* (2025.01)
*G02B 5/20* (2006.01)
*H10H 20/01* (2025.01)

(52) U.S. Cl.
CPC ........... *H10H 20/8512* (2025.01); *G02B 5/20* (2013.01); *H10H 20/01* (2025.01); *H10H 20/0361* (2025.01)

(58) Field of Classification Search
CPC ............. H01L 33/502; H01L 33/005; H01L 2933/0041; H01L 33/44; H01L 2933/0025; H01L 33/58; H01L 2933/0058; G02B 5/20; G02B 5/005; G02B 5/23; H10H 20/8512; H10H 20/01; H10H 20/0361; H10H 20/855; H10H 20/034; H10H 20/0363; H10H 20/84
See application file for complete search history.

(56) References Cited

U.S. PATENT DOCUMENTS

| 2011/0291113 | A1 | 12/2011 | Chamberlin |
| 2015/0008464 | A1* | 1/2015 | Iwakura .......... H01L 33/502 257/98 |
| 2017/0345984 | A1 | 11/2017 | Yamashita |
| 2018/0149954 | A1 | 5/2018 | Akiyama |
| 2018/0231881 | A1 | 8/2018 | Akiyama |
| 2019/0296199 | A1* | 9/2019 | Hashimoto ........ H01L 33/58 |
| 2020/0274323 | A1 | 8/2020 | Onuma et al. |
| 2020/0332984 | A1 | 10/2020 | Yamashita et al. |
| 2021/0109430 | A1 | 4/2021 | Akiyama |
| 2021/0296409 | A1* | 9/2021 | Yamazaki ......... H10K 50/858 |

FOREIGN PATENT DOCUMENTS

| JP | 2013-527617 A | 6/2013 |
| JP | 2013209570 A * | 10/2013 |
| JP | 2016-050925 A | 4/2016 |

(Continued)

*Primary Examiner* — Jonathan Han
(74) *Attorney, Agent, or Firm* — Foley & Lardner LLP

(57) ABSTRACT

A light-transmissive member includes: a light transmitting portion having an emission surface from which light is emitted; and a metal region on the emission surface, wherein the metal region comprises either (i) a metal film having a thickness in a range of 1 nm to 10 nm, or (ii) dispersed metal particles each having a maximum length in a direction perpendicular to the emission surface in a range of 1 nm to 100 nm.

15 Claims, 19 Drawing Sheets

(56) References Cited

FOREIGN PATENT DOCUMENTS

| | | |
|---|---|---|
| JP | 2017-216362 A | 12/2017 |
| JP | 2018-087918 A | 6/2018 |
| JP | 2018-088307 A | 6/2018 |
| JP | 2018-132594 A | 8/2018 |
| JP | 2020-136672 A | 8/2020 |
| JP | 2020-177199 A | 10/2020 |
| KR | 20200116255 A | 10/2020 |

* cited by examiner

LIGHT-TRANSMISSIVE MEMBER AND METHOD OF MANUFACTURING THE SAME, OPTICAL MEMBER, AND LIGHT EMITTING DEVICE

CROSS-REFERENCE TO RELATED APPLICATION

This application claims priority to Japanese Patent Application No. 2020-198900, filed on Nov. 30, 2020, and Japanese Patent Application No. 2021-121667, filed on Jul. 26, 2021. The entire contents of these applications are hereby incorporated by reference.

BACKGROUND

The present disclosure relates to a light-transmissive member, a method of manufacturing the light-transmissive member, an optical member, and a light emitting device.

A light-transmissive member in which a metal is disposed on a portion of a light transmitting portion containing a phosphor is known. For example, JP 2013-209570 A discloses a technology for a fluorescent complex in which a metal is adhered to a surface of a phosphor in order to utilize a plasmon (near field) effect of the metal.

SUMMARY

One object of the present disclosure is to provide a light-transmissive member, a light emitting device, and the like that can emit light having an adjusted chromaticity.

A light-transmissive member according to one embodiment of the present disclosure includes a light transmitting portion having an emission surface from which light is emitted; and a metal region on the emission surface, the metal region having a film shape with a thickness in a range of 1 nm to 10 nm or containing a particulate form of metal that is dispersed in the metal region and that has a maximum length in a range of 1 nm to 100 nm in a direction perpendicular to the emission surface.

An optical member according to another embodiment of the present disclosure includes the light-transmissive member according to the one embodiment of the present disclosure, and a light-transmissive plate-shaped member disposed on an incident surface side of the light transmitting portion.

A light emitting device according to still another embodiment of the present disclosure includes the light-transmissive member according to the one embodiment of the present disclosure, or the optical member according to the another embodiment of the present disclosure. The light-transmissive member is configured to allow light emitted from a light emitting element to emit through the metal region in the emission surface.

A method of manufacturing a light-transmissive member according to yet another embodiment of the present disclosure includes providing a light transmitting portion having an emission surface from which light is emitted, disposing a metal film having a thickness in a range of 1 nm to 10 nm on the emission surface, and heating the metal film on the emission surface to form a metal region containing a particulate form of metal, the particulate form of metal obtained by the heating.

According to certain embodiments of the present disclosure, a light-transmissive member, an optical member, and a light emitting device that can emit light having an adjusted chromaticity can be provided.

DETAILED DESCRIPTION

Figure 1:
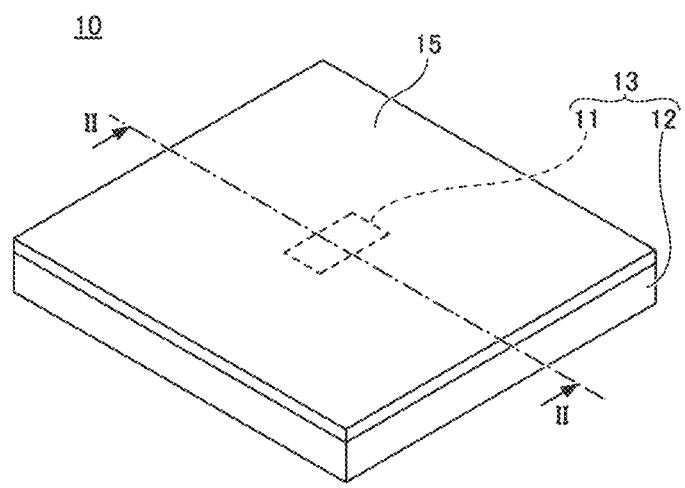
FIG. 1 is a schematic perspective view exemplifying a light-transmissive member according to a first embodiment.

Hereinafter, certain embodiments of the present invention will be described with reference to the drawings. In the description below, terms indicating a specific direction or position (e.g., "upper," "lower," and other terms including those terms) are used when necessary. Those terms are used to facilitate understanding of the invention with reference to the drawings, and the technical scope of the invention is not limited by the meaning of those terms. In addition, parts designated with the same reference numerals appearing in a plurality of drawings indicate identical or equivalent parts or members.

In the present disclosure, regarding polygonal shapes such as triangular shapes and quadrangular shapes, such polygonal shapes with rounded corners, bevel corners, recessed corners, inverted rounded corners, and the like, are included within the term "polygonal shape." Further, not only such shapes with modifications at corners (ends of sides) but also such shapes with modifications at intermediate portions of sides are referred to as "polygonal shape." That is, polygon-based shapes with partial modifications are included in the interpretation of the "polygonal shape" described in this disclosure.

The same applies not only to polygons but also to terms representing specific shapes such as trapezoids, circles, protrusions, and recesses. Further, the same applies to side (s) forming that shape. Even when an end portion or an intermediate portion of a side of such a shape are modified, the interpretation of "side" includes the modified portion. When a "polygonal shape" or a "side" without such partial modification is to be distinguished from a processed shape, "in a strict sense" will be added to the description as in, for example, "quadrangular shape in a strict sense."

Further, the embodiments to be described below exemplify light-transmissive members and the like for embodying the technical ideas of the present invention, and the present invention is not limited to the description below. In addition, unless otherwise specified, the dimensions, materials, shapes, relative arrangements, and the like of constituent elements described below are not intended to limit the scope of the present invention to those descriptions, but are intended to be exemplary. Some or all of the contents described in any one of the embodiments can be applied to the other embodiments and variant examples. At least, when the contents described in any one of the embodiments appear in the drawings according to another embodiment or a variant example, it means that the contents can be applied to the another embodiment and the variant example. The size, positional relationship, and the like of the members illustrated in the drawings can be exaggerated in order to clarify the explanation. Furthermore, in order to avoid excessive complication of the drawings, a schematic view in which some elements are not illustrated may be used, or an end view illustrating only a cut surface may be used as a cross-sectional view.

First Embodiment

FIG. 1 is a schematic perspective view exemplifying a light-transmissive member according to a first embodiment.

Figure 2:
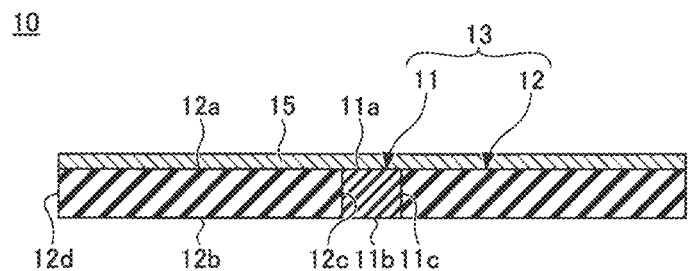
FIG. 2 is a schematic cross-sectional view taken along line II-II of FIG. 1 exemplifying the light-transmissive member according to the first embodiment.

FIG. 2 is a schematic cross-sectional view taken along line II-II of FIG. 1 exemplifying the light-transmissive member according to the first embodiment.

As illustrated in FIGS. 1 and 2, a light-transmissive member 10 includes a composite member 13 and a metal region 15.

Components of the light-transmissive member 10 will be described.

Composite Member 13

The composite member 13 can include a light transmitting portion 11 and a light reflecting portion 12. The light reflecting portion 12 is not an essential constituent component and is provided when necessary. For example, in FIG. 1, a light transmitting portion same as the light transmitting portion 11 or different from the light transmitting portion 11 may be employed instead of the light reflecting portion 12.

The light transmitting portion 11 has an upper surface 11a, a lower surface 11b opposite to the upper surface 11a, and one or a plurality of lateral surfaces 11c meeting the upper surface 11a and the lower surface 11b. The one or the plurality of lateral surfaces 11c connects outer edges of the upper surface 11a and outer edges of the lower surface 11b. The light transmitting portion 11 has, for example, a rectangular parallelepiped shape or a cube shape. In this case, both the upper surface 11a and the lower surface 11b of the light transmitting portion 11 have a rectangular shape, and the light transmitting portion 11 has four lateral surfaces 11c, each having a rectangular shape. The term "rectangular shape" as used herein refers to a rectangular shape or a square shape.

The light transmitting portion 11 is not limited to a rectangular parallelepiped shape or a cube shape. For example, a planar shape of the light transmitting portion 11 is not limited to a rectangular shape, and can be any appropriate shape such as a circular shape, an elliptic shape, or a polygonal shape. When the light transmitting portion 11 has a cylindrical shape, the upper surface 11a and the lower surface 11b of the light transmitting portion 11 both have a circular shape, and the light transmitting portion 11 has a single cylindrical lateral surface 11c along circumferences of the upper surface 11a and the lower surface 11b. In the present specification, viewing an object in a normal direction with respect to the upper surface 11a of the light transmitting portion 11 may be referred to as a "plan view," and a shape of the object viewed in a normal direction of the upper surface 11a of the light transmitting portion 11 may be referred to as a "planar shape."

The light transmitting portion 11 transmits light from the lower surface 11b to the upper surface 11a, for example. The light transmitting portion 11 allows light incident on the lower surface 11b and traveling upward to emit from the upper surface 11a. The lower surface 11b can serve as an incident surface on which light is incident, and the upper surface 11a can serve as an emission surface from which light is emitted. The upper surface 11a may serve as an incident surface on which light is incident, and may serve as an emission surface from which light is emitted. The light transmitting portion 11 is adapted to transmit light. The light transmitting portion 11 may be transmissive to light having a wavelength, for example, in a range of 400 nm to 760 nm. In the present application, the expression "transmissive to light" means having a transmittance of 80% or greater for the light. In addition, when the light has wavelengths in a certain wavelength range, the expression "transmissive to light" means having a transmittance of 80% or greater for at least the peak wavelength of light.

The light transmitting portion 11 is to be irradiated with light, and accordingly is preferably formed using an inorganic material that is not easily decomposed by light irradiation as a main material. Examples of the main material include a ceramic. Examples of a ceramic used for the main material include aluminum oxide, aluminum nitride, silicon oxide, yttrium oxide, zirconium oxide, and magnesium oxide. The ceramic used for the main material is preferably selected from materials having a melting point in a range of 1300° C. to 2500° C. so that the light transmitting portion 11 is not deformed or discolored by heat. The light transmitting portion 11 is, for example, a sintered body formed of a ceramic as a main material. The term "main material" as used herein refers to a material that occupies the largest ratio of a constituent element in terms of weight ratio or volume ratio. Also, the term "main material" includes a material forming a component without other materials, that is, there may be a case in which the component is made of only the main material.

The light transmitting portion 11 may be a wavelength conversion portion containing a phosphor. When the light transmitting portion 11 is the wavelength conversion portion, the light transmitting portion 11 can, for example, convert light incident on the incident surface into light having a different wavelength, and emit the converted light from the emission surface. The light transmitting portion 11 may emit a portion of the incident light. The light transmitting portion 11 may convert an entirety of the incident light into light having the different wavelength. In this case, the light incident on the light transmitting portion 11 is not emitted from the light transmitting portion 11 without being converted.

When the light transmitting portion 11 is a wavelength conversion portion, the light transmitting portion 11 can be formed by sintering, for example, a phosphor and a light-transmissive material such as aluminum oxide. The content of the phosphor can be in a range of 0.05 vol % to 50 vol % with respect to the total volume of the ceramics. Further, for example, the light transmitting portion 11 may be formed by sintering a powder of the phosphor, that is, using a ceramic substantially consisting of only the phosphor. Furthermore, the light transmitting portion 11 may be formed of a single crystal of a phosphor.

Examples of the phosphor include yttrium aluminum garnet (YAG) phosphor activated with cerium, lutetium aluminum garnet (LAG) phosphor activated with cerium, silicate phosphor activated with europium (($Sr, Ba)_2SiO_4$), αSiAlON phosphor, βSiAlON phosphor, and the like. Among them, garnet-based phosphors such as YAG phosphor and LAG phosphor have good heat resistance.

For example, there may be a usage mode in which the light transmitting portion 11 contains YAG phosphor, and blue light is incident on the light transmitting portion 11. In this case, when the blue excitation light is incident, the blue excitation light and the fluorescence can be mixed to emit white light.

The light reflecting portion 12 is, for example, a frame-shaped member having a rectangular opening. The light reflecting portion 12 has an upper surface 12a, a lower surface 12b opposite to the upper surface 12a, one or a plurality of inner lateral surfaces 12c each connecting a respective one of inner edges of the upper surface 12a and a respective one of inner edges of the lower surface 12b, and one or a plurality of outer lateral surfaces 12d each connecting a respective one of outer edges of the upper surface 12a and a respective one of outer edges of the lower surface 12b. The outer edges of the upper surface 12a, the inner edges of the upper surface 12a, the outer edges of the lower surface 12b, and the inner edges of the lower surface 12b form, for example, rectangular shapes, respectively. In this case, the light reflecting portion 12 has four inner lateral surfaces 12c each having a rectangular shape and four outer lateral surfaces 12d each having the rectangular shape. The outer edges of the upper surface 12a, the inner edges of the upper surface 12a, the outer edges of the lower surface 12b, and the inner edges of the lower surface 12b may form shapes other than rectangular shapes, and can form any appropriate shapes such as circular shapes, elliptic shapes, and polygonal shapes.

Examples of the light reflecting portion 12 include a sintered body using a ceramic as a main material. Examples of the ceramic used for the main material include aluminum oxide, aluminum nitride, silicon oxide, yttrium oxide, zirconium oxide, and magnesium oxide. Aluminum oxide is one of the preferred materials in relation to the method of forming the light reflecting portion 12 to be described below. For the light reflecting portion 12, a ceramic is not necessarily used as a main material. The light reflecting portion 12 may be formed using, for example, a metal, a composite of a ceramic and a metal, or the like.

In the composite member 13, the inner lateral surfaces 12c of the light reflecting portion 12 are in contact with the lateral surfaces 11c of the light transmitting portion 11. The composite member 13 has a flat plate shape, for example, a rectangular parallelepiped shape. The composite member 13 may have other shapes, and may have, for example, a cylindrical flat plate shape, or may have, for example, a shape in which the light transmitting portion 11 is recessed with respect to the light reflecting portion 12.

The upper surface 11a of the light transmitting portion 11 and the upper surface 12a of the light reflecting portion 12 may be in a single continuous plane. The lower surface 11b of the light transmitting portion 11 and the lower surface 12b of the light reflecting portion 12 may be in a single continuous plane. Alternatively, the composite member 13 may have a shape in which the upper surface 11a and/or the lower surface 11b of the light transmitting portion 11 protrudes with respect to the upper surface 12a and/or the lower surface 12b of the light reflecting portion 12. In this case, portions of the lateral surfaces 11c of the light transmitting portion 11 are in contact with the inner lateral surfaces 12c of the light reflecting portion 12.

The light transmitting portion 11 and the light reflecting portion 12 may be, for example, separately provided and may be bonded together to obtain the composite member 13. Alternatively, for example, the light transmitting portion 11 and the light reflecting portion 12 may be integrally formed. The light transmitting portion 11 and the light reflecting portion 12 can be formed of, for example, an integral sintered body. Porosity in the light transmitting portion 11 and the light reflecting portion 12 can also be adjusted. The porosity can be adjusted by adjusting a sintering conditions (sintering temperature, sintering time, rate of increase in temperature), particle size of materials, concentration of a sintering aid, and the like.

The light reflecting portion 12 has three-dimensional or two-dimensional reflecting regions adapted to reflect light on one or the plurality of inner lateral surfaces 12c or vicinities thereof. For example, when forming the light reflecting portion 12 using a ceramic as a main material, the light reflecting portion 12 can be formed to have void spaces in and near the one or plurality of inner lateral surfaces 12c, so that the light reflecting portion 12 having reflecting regions can be obtained. The light reflecting portion 12 does not necessarily have the void spaces only in and near the one or plurality of inner lateral surfaces 12c, but may have void spaces in the entire interior of the light reflecting portion 12. The light reflecting portion 12 formed of aluminum oxide as a main material can be have a reflecting region having high reflectance due to presence of the void spaces, and thus can be considered as one of the preferred materials for the light reflecting portion 12.

In the composite member 13, the porosity of the light reflecting portion 12 is greater than the porosity of the light transmitting portion 11. In other words, the composite member 13 is formed such that the light reflecting portion 12 includes more void spaces than does the light transmitting portion 11. It is preferable to adjust the sintering conditions so that the porosity of the light reflecting portion 12 is approximately 10%. With such a porosity, a reflecting region with air in the void spaces is formed at a boundary between the lateral surface 11c of the light transmitting portion 11 and the inner lateral surface 12c of the light reflecting portion 12, and light striking the inner lateral surface 12c of the light reflecting portion 12 from the light transmitting portion 11 side can be reflected to the light transmitting portion 11 side. It is preferable to adjust the sintering conditions so that the porosity of the light transmitting portion 11 is 20% or less. With such a porosity, the light reflecting portion 12 can have sufficient strength.

Metal Region 15

The metal region 15 is a metal film having a thickness in a range of 1 nm to 10 nm. Alternatively, the metal region 15 is a region in which metal particles each having a maximum length in a range of 1 nm to 100 nm in the thickness direction are dispersed. The metal in a particulate form that constitute the metal region 15 can be formed by, for example, heating a metal film with a thickness in a range of 1 nm to 10 nm. The metal film can be formed to have a thickness of 1 nm or greater. When the metal film has a thickness of 10 nm or less, a transmittance of a certain degree or more can be obtained in a wavelength range of 400 nm to 760 nm. Hereinafter, the metal region 15 in which the metal particles are dispersed is referred to as "dispersed particulate metal."

The metal region 15 has a transmittance bottom wavelength in a wavelength range of 400 nm to 760 nm. As used herein, the "transmittance bottom wavelength" refers to a wavelength at which a linear transmittance of the metal region 15 for light incident on the metal region 15 is minimum in the wavelength range of 400 nm to 760 nm. The transmittance bottom wavelength of the metal region 15 coincides with an absorption peak wavelength of the metal region 15. Therefore, by measuring the linear transmittances of the metal region 15 in the wavelength range of 400 nm to 760 nm to obtain the transmittance bottom wavelength at which the linear transmittance is the minimum value in this wavelength range, the absorption peak wavelength of the metal region 15 in the wavelength range of 400 nm to 760 nm can be determined. In addition, a wavelength at which the linear transmittance of the metal region 15 for light incident on the metal region 15 is maximum in the wavelength range of 400 nm to 760 nm is defined as a "transmittance peak wavelength."

In the present application, the linear transmittance of the metal region 15 was measured as follows. A plate-shaped sapphire having a thickness of approximately 400 µm (in which the metal region 15 is not formed) with two opposite surfaces being mirror-finished is provided. The sapphire can be regarded as a member on which a metal film is to be formed, and can also be regarded as a member on which the metal region 15 is to be formed. Then, the ratio of light emitted perpendicularly from one surface of the two opposite surfaces of the plate-shaped sapphire to light incident perpendicularly to the other surface of the two opposite surfaces of the plate-shaped sapphire is measured, and the measurement result is defined as a linear transmittance S (%). Subsequently, the metal region 15 is formed on the one surface of the plate-shaped sapphire, the ratio of the light emitted perpendicularly from the metal region 15 to the light incident perpendicularly to the other surface of the plate-shaped sapphire is measured, and the measurement result is defined as a linear transmittance M (%). The light incident on the other surface of the plate-shaped sapphire includes at least light in a wavelength range of 400 nm to 760 nm.

The value of (linear transmittance M)/(linear transmittance S) is defined as a linear transmittance (%) of the metal region 15. In addition, the value of (linear transmittance S)−(linear transmittance M) is defined as a transmission reduction ratio (%) of the metal region 15. The term "transmission reduction ratio" can be regarded as a parameter indicating the degree of reduction in light transmission compared to the light transmission only through the member on which the metal film is to be formed, as a ratio to the incident light. Additionally, the value of 100−(linear transmittance S)+(linear transmittance M) is defined as a pseudo linear transmittance (%) of the metal region 15. The pseudo linear transmittance is a value obtained by subtracting the transmission reduction ratio from 100%, and can be regarded as a parameter indicating the transmittance as a ratio of transmitted light instead of the perspective of the reduction ratio of the transmitted light.

Further, the linear transmittance of the metal region 15 at the transmittance bottom wavelength is defined as a bottom transmittance (%). A width between two wavelengths with a reference transmittance, at which a linear transmittance is (bottom transmittance (%)+100(%))/2, that is, at which a decrease in the transmittance is a half value of the bottom transmittance, is defined as a full width at half maximum of the bottom transmittance. One of the two wavelengths with this reference transmittance is within a wavelength range in which the transmittance monotonically increases as the transmittance increases from the bottom transmittance toward the positive direction of the wavelength, and another is within a wavelength range in which the transmittance monotonically increases as the transmittance increases from the bottom transmittance toward the negative direction of the wavelength. When there are no two wavelengths that satisfy this condition, a transmittance that is a half value of a sum of the bottom transmittance and the reference transmittance is used as a reference transmittance. That is, a width between two wavelengths at each of which transmittance is (bottom transmittance (%)+((bottom transmittance (%)+100(%))/2))/2 within the wavelength range described above is regarded as a pseudo full width at half maximum of the bottom transmittance. When distinguishing between the reference transmittance based on (bottom transmittance (%)+100(%))/2 described above and the reference transmittance based on (bottom transmittance (%)+((bottom transmittance (%)+100(%))/2))/2 described above, the former is referred to as a "first reference transmittance" and the latter is referred to as a "second reference transmittance." When there are no two wavelengths that satisfy the condition in the second reference transmittance, a transmittance that is a half value of a sum of the bottom transmittance and the second reference transmittance is set as a reference transmittance in a similar manner. This transmittance is referred to as a "third reference transmittance," and the Nth reference transmittance can be defined by the same regularity for the third and subsequent reference transmittances.

Hereinafter, the full width at half maximum of the bottom transmittance in one metal region 15 formed under certain conditions may be described. In such a case, it is assumed that the description is based on the full width at half maximum of the bottom transmittance in the Nth reference transmittance at which N is the minimum. That is, the description below may be based on the pseudo full width at half maximum of the bottom transmittance. Further, the full widths at half maximum of the bottom transmittances in two or more metal regions 15 produced under different conditions may be compared and described. In such a case, it is assumed that the description is based on the existence of the two wavelengths in each of the two metal regions 15, and based on the full widths at half maximum of the bottom transmittances at the Nth reference transmittance where N is the minimum. Depending on the comparison object, such an N may not exist. Hereinafter, such an Nth reference transmittance will be simply referred to as a "reference transmittance."

Similarly, the pseudo linear transmittance of the metal region 15 at the transmittance bottom wavelength is defined as a pseudo bottom transmittance (%). A full width at half maximum of the pseudo bottom transmittance can also be determined based on the pseudo linear transmittance by a calculation similar to that for determining the full width at half maximum of the bottom transmittance. The Nth reference pseudo transmittance may be determined in the same manner.

The bottom transmittance of the metal region 15 is in a range of 45% to 98%. When the amount of light and the chromaticity adjustment is to be balanced, in one aspect, the bottom transmittance of the metal region 15 is preferably in a range of 70% to 95%. The difference between the maximum transmittance and the bottom transmittance (transmittance gap) of the metal region 15 in the wavelength range of 400 nm to 760 nm is in a range of 5% to 30%. In addition, in view of effectively obtaining the chromaticity adjustment, in another aspect, the transmittance gap is preferably in a range of 5% to 20%.

With at least one transmittance bottom wavelength (i. e., absorption peak wavelength) in the wavelength range of 400 nm to 760 nm in the metal region 15, a chromaticity point of light emitted from the metal region 15 can be shifted to a chromaticity point of light incident on the metal region 15 in the wavelength range of 400 nm to 760 nm.

The pseudo bottom transmittance of the metal region 15 is in a range of 50% to 95%. When the amount of light and the chromaticity adjustment is to be balanced, in still another aspect, the pseudo bottom transmittance of the metal region 15 is preferably in a range of 80% to 95%. The difference between the maximum pseudo transmittance and the pseudo bottom transmittance (pseudo transmittance gap) of the metal region 15 in the wavelength range of 400 nm to 760 nm is in a range of 5% to 30%. In addition, in view of effectively obtaining the chromaticity adjustment, in yet another aspect, the pseudo transmittance gap is preferably in a range of 5% to 20%.

The metal region 15 can contain a particulate form of metal. In the present specification, the term "particulate form of metal" refers to a state of metal that includes containing separate particles, which may also include a metal that is not in a continuous state. In the particulate form of metal, some particles may be connected to each other. The separate particles have any appropriate shape such as a spherical shape, a flat shape, a star shape, an indeterminate shape, or the like. A size of the particles is not necessarily identical, and large particles and small particles may be contained. The metal region 15 may be formed only of particles.

A particulate form of metal can be obtained by forming a thin metal film on the order of nanometers and heat-treating the film, but in this case, the sizes of the obtained particulate metal are different from the thickness when formed. Thus, when a particulate form of metal is obtained from the metal film, even with a thickness of the metal film in a range of 1 nm to 10 nm, the sizes of the obtained particulate metal can be greater than the thickness of the metal film. Also, the maximum length of each of the metal particles in the same direction as the thickness (in this case, the direction perpendicular to the film forming surface) can be greater than the thickness of the metal film.

By adjusting the conditions for containing the particulate metal in the metal region 15, the transmittance bottom wavelength of the metal region 15 can be adjusted for the light in the wavelength range of 400 nm to 760 nm incident on the metal region 15. "Adjusting the conditions" includes not only adjustment for whether the metal region 15 contains a particulate metal, but may also include adjustment in a forming state such as the dispersion or size of the particulate metal. By changing the conditions, the transmittance bottom wavelength of the metal region 15 can be changed. Further, by changing the conditions, the transmittance of the metal region 15 at the transmittance bottom wavelength can be changed. Furthermore, by changing the conditions, the full width at half maximum of the bottom transmittance of the metal region 15 can be narrowed to the light in the wavelength range of 400 nm to 760 nm incident on the metal region 15.

The metal region 15 containing a particulate metal tends to shift the transmittance bottom wavelength of the metal region 15 toward the short wavelength side as compared with the metal region 15 that does not contain the particulate metal (for example, a metal film). Further, the full width at half maximum of the bottom transmittance at the reference transmittance tends to be narrower in the metal region 15 containing a particulate metal than the metal region 15 not containing the particulate metal. Allowing adjustment in the transmittance bottom wavelength and the full width at half maximum of the bottom transmittance allows for less easily transmitting light in a predetermined wavelength range as compared with light in other wavelength ranges.

When the full width at half maximum of the bottom transmittance is desired to be narrow, in the region where the metal region 15 is formed, it is preferable that the metal region 15 is such that a ratio of a particulate metal to the area of the region is in a range of 10% to 60%. With such a ratio of a particulate metal, the effect of narrowing the full width at half maximum of the bottom transmittance can be sufficiently obtained as compared with the metal region 15 not containing a particulate metal. In other words, the transmittances of wavelengths other than the transmittance bottom wavelength can be increased. In the region where the metal region 15 is formed, the ratio of a particulate metal to the area of the region can be measured by image processing an SEM photograph (scanning electron micrograph) of the metal region 15.

When the metal region 15 contains a particulate metal, the size of each metal particle is preferably 200 nm or less, and more preferably 50 nm or less. When the metal region 15 contains a particulate metal, the particle size of the particulate metal is preferably one-third or less, more preferably one-tenth or less, of the wavelength included in the wavelength range of the full width at half maximum of the bottom transmittance of the metal region 15. When the metal region 15 contains a particulate metal, the particle size of the metal is preferably one-third or less, more preferably one-tenth or less, of the transmittance bottom wavelength of the metal region 15. With such a size of the particulate metal, light in a predetermined wavelength range can be absorbed, and absorption of light in other wavelength ranges can be reduced. For example, the full width at half maximum of the bottom transmittance can be narrowed to increase the transmittances of wavelengths other than the transmittance bottom wavelength. Accordingly, decrease in the amount of light emitted from the metal region 15 (light emission efficiency) can be reduced.

When the metal region 15 contains a particulate metal, the maximum length of each of the metal particles in the direction perpendicular to the surface on which the metal region 15 is provided is preferably in a range of 1 nm to 100 nm, more preferably in a range of 40 nm to 60 nm. With such a size of the particulate metal, light in a specific wavelength range can be absorbed, and absorption of light in other wavelength ranges can be reduced. For example, the full width at half maximum of the bottom transmittance can be narrowed to increase the transmittances of wavelengths other than the transmittance bottom wavelength. Accordingly, a decrease in the amount of light emitted from the metal region 15 (light emission efficiency) can be reduced.

A metal that forms the metal region 15 can be appropriately selected in consideration of the absorption peak wavelength inherent in the metal. Selecting a material whose absorption peak wavelength is longer than the desired transmittance bottom wavelength, the ratio of the particulate metal to be contained can be adjusted to match the absorption peak wavelength of the metal region 15 to the desired transmittance bottom wavelength.

For example, with the use of gold as a material, the metal region 15 can be formed to have a transmittance bottom wavelength in a wavelength range of 500 nm to 600 nm, and a full width at half maximum of the bottom transmittance at the reference transmittance is in a range of 20 nm to 130 nm. For example, with the use of gold as a material, the metal region 15 can be formed to have a transmittance bottom wavelength in a wavelength range of 520 nm to 580 nm, and a full width at half maximum of the bottom transmittance at the reference transmittance is in a range of 20 nm to 100 nm. For example, with the use of gold as a material, the metal region 15 can be formed to have a transmittance bottom wavelength in a wavelength range of 520 nm to 550 nm, and a full width at half maximum of the bottom transmittance at the reference transmittance is in a range of 20 nm to 80 nm.

Light-Transmissive Member 10

The metal region 15 is formed on at least the upper surface 11a of the light transmitting portion 11, which is the emission surface. The metal region 15 may extend from the upper surface 11a of the light transmitting portion 11 to the upper surface 12a of the light reflecting portion 12. The metal region 15 may be formed on the entire upper surface 11a of the light transmitting portion 11 and entire upper surface 12a of the light reflecting portion 12 (that is, the entirety of the upper surface of the composite member 13).

In the light-transmissive member 10, the upper surface 11a side of the light transmitting portion 11 on which the metal region 15 is formed serves as a light emitting side, and the lower surface 11b side of the light transmitting portion 11 serves as a light incident side. In other words, light incident on the light transmitting portion 11 is emitted via the metal region 15. A portion of light may also be incident on the lower surface 12b of the light reflecting portion 12.

The light reflecting portion 12 is adapted to reflect light traveling from the light transmitting portion 11 toward the light reflecting portion 12 on the inner lateral surface 12c. The "light traveling from the light transmitting portion 11 toward the light reflecting portion 12" is the light incident on the light transmitting portion 11. When the light transmitting portion 11 is a wavelength conversion portion containing a phosphor, the light reflecting portion 12 is adapted to reflect light incident on the light transmitting portion 11 or light whose wavelength is converted by the light transmitting portion 11 on the inner lateral surface 12c. The light reflecting portion 12 is preferably formed of a material having a high thermal conductivity to discharge heat generated in the light transmitting portion 11. The light reflecting portion 12 can be formed of, for example, aluminum oxide ($Al_2O_3$), which is a ceramic material having a high thermal conductivity.

In the light-transmissive member 10, when light in the wavelength range of 400 nm to 760 nm is incident on the light transmitting portion 11, the metal region 15 absorbs incident light in a wavelength range of, for example, 500 nm to 600 nm. That is, the light transmitting portion 11 on which the metal region 15 is formed allows the ratio of light in the wavelength range of 500 nm to 600 nm in the entirety of light in the wavelength range of 400 nm to 760 nm to be smaller than a case in which light in a wavelength range of 500 nm to 600 nm passes through the light transmitting portion 11 in which the metal region 15 is absent.

The light-transmissive member 10 may include a film other than the metal region 15. For example, a light-shielding film formed of metal or the like on the metal region 15 may be disposed on the upper surface 12a of the light reflecting portion 12. The light-shielding film can be formed with a thickness in a range of, for example, 50 nm to 500 nm. With the light-shielding film, light leakage from a region other than the metal region 15 formed on the upper surface 11a of the light transmitting portion 11 serving as the emission surface can be reduced. The metal region 15 may be provided on the light-shielding film.

Method of Manufacturing Light-Transmissive Member 10

Figure 3:
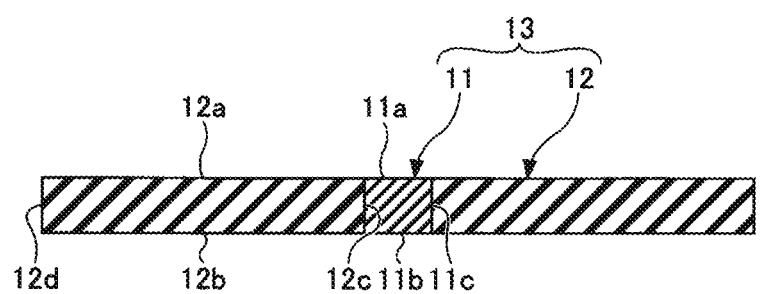
FIG. 3 is a schematic diagram (No. 1) exemplifying a method of manufacturing the light-transmissive member according to the first embodiment.
Figure 4:
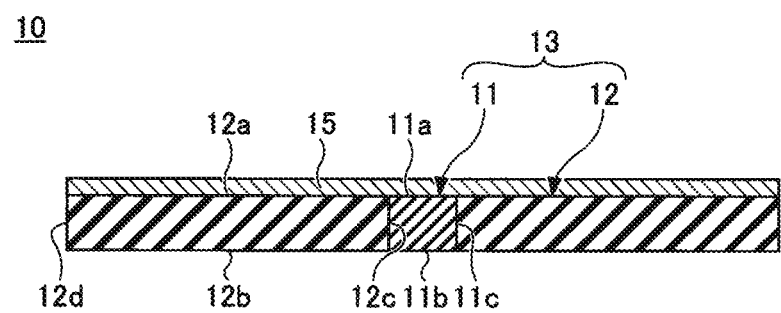
FIG. 4 is a schematic diagram (No. 2) exemplifying the method of manufacturing the light-transmissive member according to the first embodiment.

FIGS. 3 and 4 are diagrams exemplifying a method of manufacturing the light-transmissive member according to the first embodiment. As illustrated in FIG. 3, the composite member 13 including the light transmitting portion 11 and the light reflecting portion 12 is provided. The composite member 13 can be provided, for example, by manufacturing from the light transmitting portion 11 and the light reflecting portion 12. Alternatively, instead of manufacturing the composite member 13, the composite member 13 may be provided by purchasing.

When manufacturing the composite member 13, the composite member 13 can be manufactured, for example, by bonding the lateral surface 11c of the light transmitting portion 11 and the inner lateral surface 12c of the light reflecting portion 12 with an adhesive. Alternatively, the composite member 13 can be formed, for example, by integrally sintering the light transmitting portion 11 and the light reflecting portion 12. In this case, for example, the composite member 13 can be formed by integrally compacting and sintering a powder material for the sintered body of the light transmitting portion 11 and a powder material for the sintered body of the light reflecting portion 12. For sintering, for example, a pressureless sintering method, a spark plasma sintering method (SPS method), a hot press sintering method (HP method), and the like can be used.

Subsequently, as illustrated in FIG. 4, the metal region 15 is formed at least on the upper surface 11a of the light transmitting portion 11. In order to form the metal region 15, a metal film is formed to have a thickness in a range of 1 nm to 10 nm. The metal region 15 can be the metal film or the distributed particulate metal. Examples of a metal to form the metal film include gold. The metal may be appropriately selected based on the wavelength range in which the transmittance is to be smaller than that of the other wavelength ranges, and the transmittance characteristics of the metal. The term "transmittance characteristics of the metal" as used herein includes not only the transmittance characteristics of the thin film of the metal alone, but also the transmittance characteristics when the metal is heat-treated.

Therefore, an appropriate metal may be selected based on these characteristics. The metal film may be formed on the entire upper surface 11a of the light transmitting portion 11 and the entire upper surface 12a of the light reflecting portion 12. The metal film can be formed by, for example, sputtering. At this time, the metal film is formed continuously rather than in the form of particles. After forming the metal film, the metal film is heated. Through the step of heating the metal film, a metal contained in the metal film is rendered into a particulate form. That is, through the step of heating the metal film, the metal region 15 containing the particulate form of metal is formed. Through the step of heating the metal film, a metal contained in the metal film is rendered into a particulate form, and in the region where the metal region 15 is formed, the ratio of the particulate metal substance to the area of the region is in a range, for example, from 10% to 60%. Thus, the light-transmissive member 10 is obtained.

When a metal contained in the metal film is rendered into a particulate form, the metal film is heated at a temperature in a range of 500° C. to 1100° C. In view of increasing the overall transmittance in the wavelength range of 400 nm to 760 nm, the metal film is preferably heated at a temperature in a range of 900° C. to 1100° C. The heat treatment is preferably performed in an air atmosphere. The heat treatment is preferably performed for approximately one hour. The heat treatment preferably does not exceed 10 hours in the air atmosphere. Under these conditions, a good state of particulate form of metal can be created. The heating temperature conditions described above are temperature conditions at atmospheric pressure.

It is also possible to provide only the light transmitting portion 11 in the step of FIG. 3, and to form the metal film on the upper surface 11a of the light transmitting portion 11 and then heat the metal film in the step of FIG. 4. In this case, the light-transmissive member 10 having the light transmitting portion 11 and the metal region 15, and not having the light reflecting portion 12 is produced.

Light Absorption of Metal Region 15

Figure 5A:
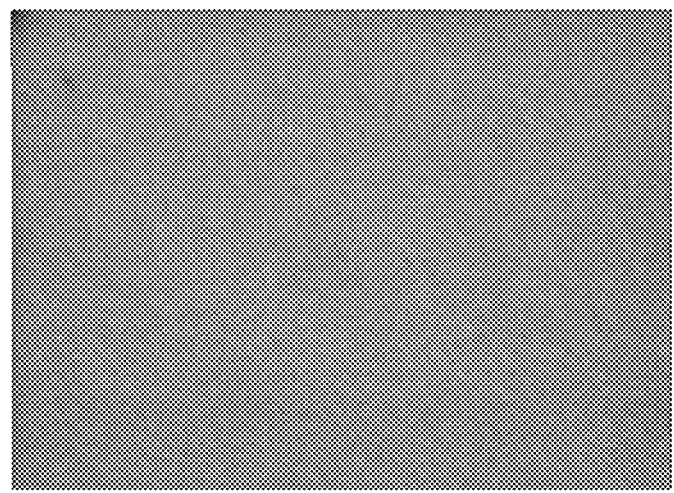
FIG. 5A is an SEM photograph of a metal film with a thickness of 1 nm before heating.
Figure 5B:
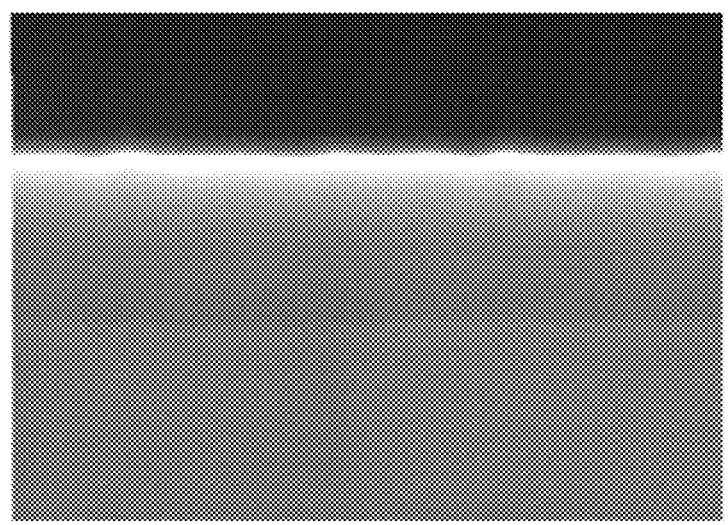
FIG. 5B is another SEM photograph of the metal film with the thickness of 1 nm before heating.
Figure 6A:
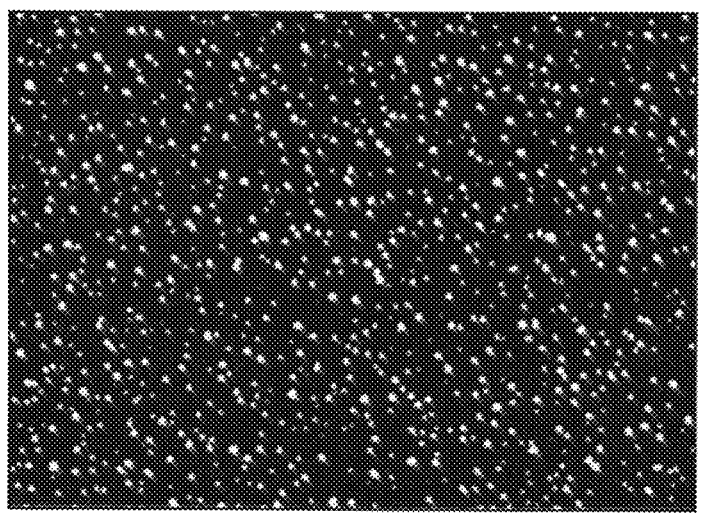
FIG. 6A is an SEM photograph of the metal film with the thickness of 1 nm after heating.
Figure 6B:
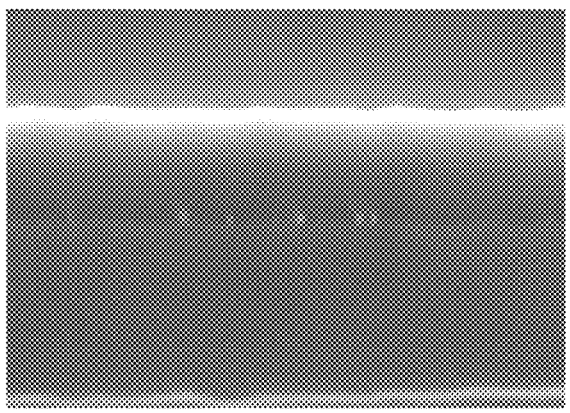
FIG. 6B is another SEM photograph of the metal film with the thickness of 1 nm after heating.
Figure 7A:
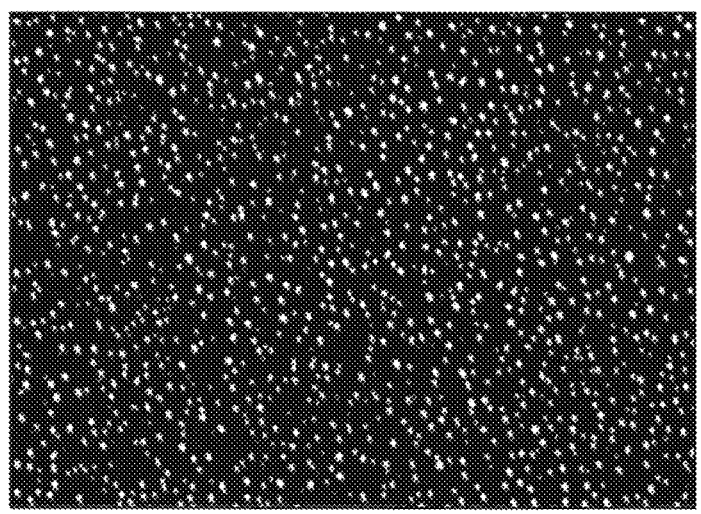
FIG. 7A is an SEM photograph of a metal film with a thickness of 2 nm after heating.
Figure 7B:
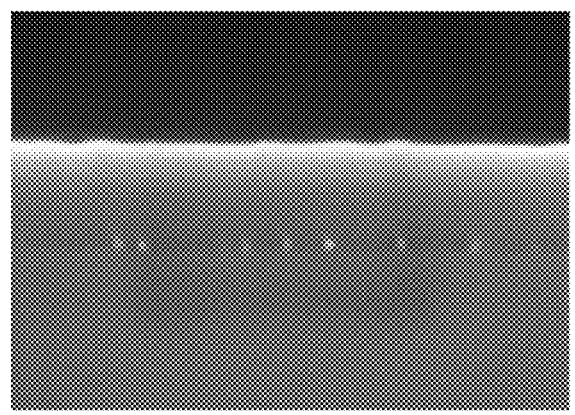
FIG. 7B is another SEM photograph of the metal film with the thickness of 2 nm after heating.
Figure 8A:
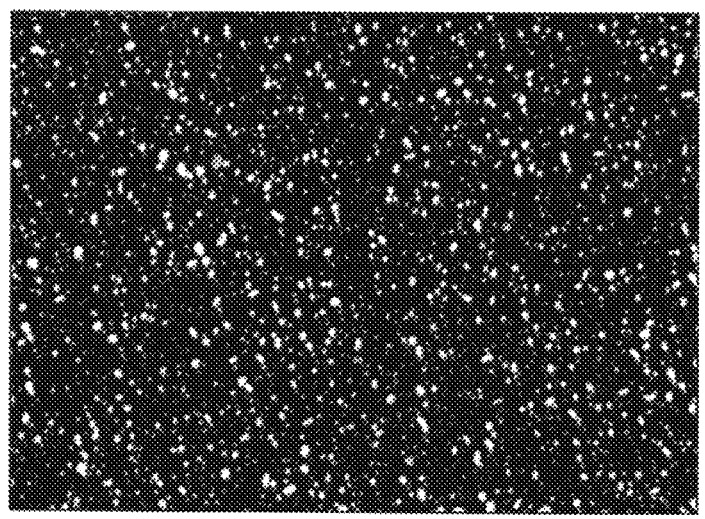
FIG. 8A is an SEM photograph of a metal film with a thickness of 3 nm after heating.
Figure 8B:
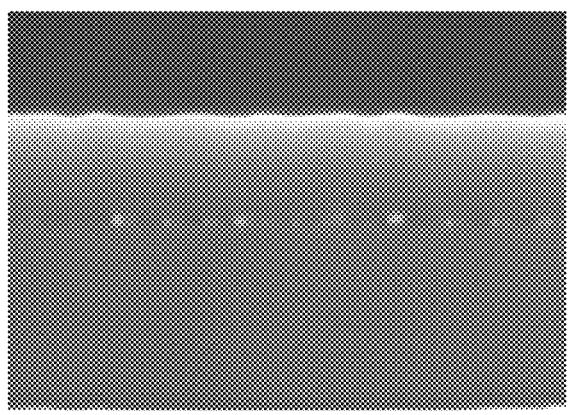
FIG. 8B is another SEM photograph of the metal film with the thickness of 3 nm after heating.
Figure 9A:
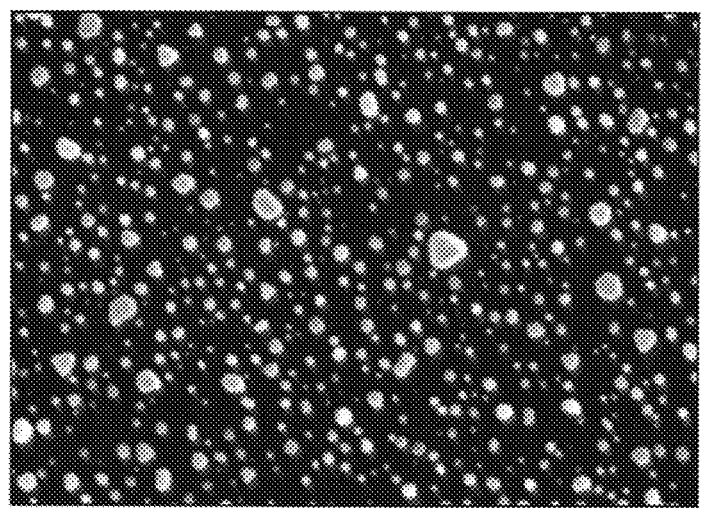
FIG. 9A is an SEM photograph of a metal formed with a thickness of 5 nm after heating.
Figure 9B:
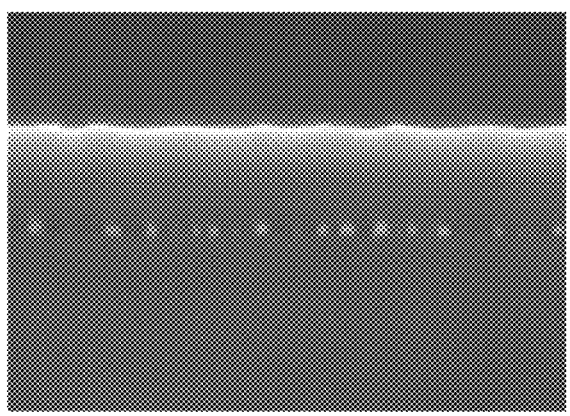
FIG. 9B is another SEM photograph of the metal film with the thickness of 5 nm after heating.

FIGS. 5A to 9B are SEM photographs related to obtaining particulate form of metal forming the metal region. In the example herein, the metal that forms the metal film is gold. FIGS. 5A and 5B are SEM photographs of a metal film formed with a thickness of 1 nm that are taken before heating. FIGS. 6A and 6B are SEM photographs of the metal film formed with the thickness of 1 nm that are taken after heating. FIGS. 7A and 7B are SEM photographs of a metal film formed with a thickness of 2 nm that are taken after heating. FIGS. 8A and 8B are SEM photographs of a metal film formed with a thickness of 3 nm that are taken after heating. FIGS. 9A and 9B are SEM photographs of a metal film formed with a thickness of 5 nm that are taken after heating. Each of FIGS. 5A, 6A, 7A, 8A, and 9A illustrates a surface of the formed film is formed, and each of FIGS. 5B, 6B, 7B, 8B, and 9B illustrates a cross section. Further, the heating conditions for the metal films illustrated in FIGS. 6A to 9B are 1000° C. for 1 hour under air atmosphere and atmospheric pressure.

From FIG. 5A, it can be seen that the metal film before heating is formed continuously rather than in the form of particles. That is, before heating, the metal region is in a film-like shape. As illustrated in each of FIGS. 6A, 7A, 8A, and 9A, a metal (in this case, gold) that forms the metal film is rendered into a particulate form by heating at 1000° C. for 1 hour under air atmosphere and atmospheric pressure. The greater the thickness of the metal film when the film is formed, the larger the number of particles. When the metal film is formed to have a thickness of 3 μm or greater, the size of the particles tends to be increased. The heating temperature is not necessarily 1000° C. By heating the metal film at a temperature in a range of 900° C. to 1100° C., a metal that forms the metal region can be rendered into a particulate form.

Figure 10:
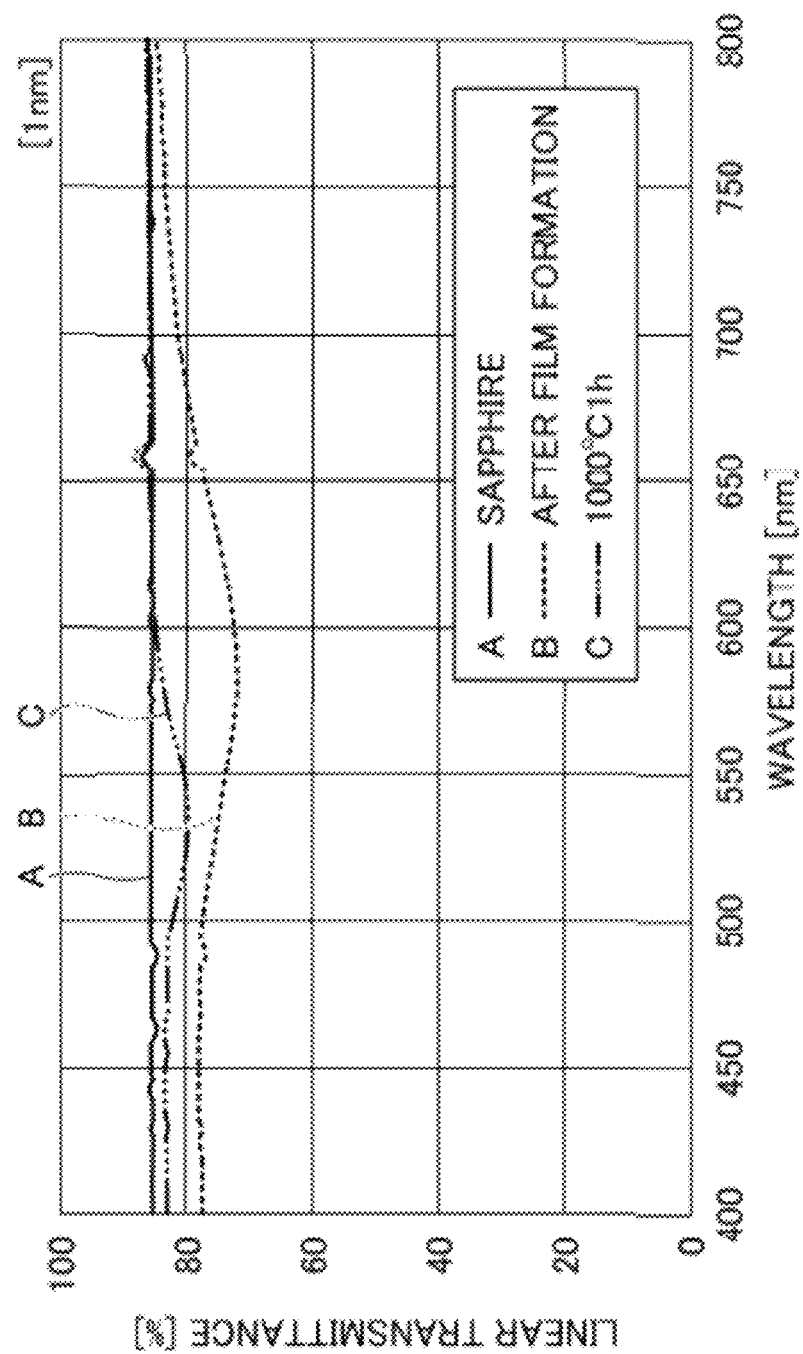
FIG. 10 is a diagram exemplifying a change in linear transmittance before and after heating of the metal film having the thickness of 1 nm.
Figure 11:
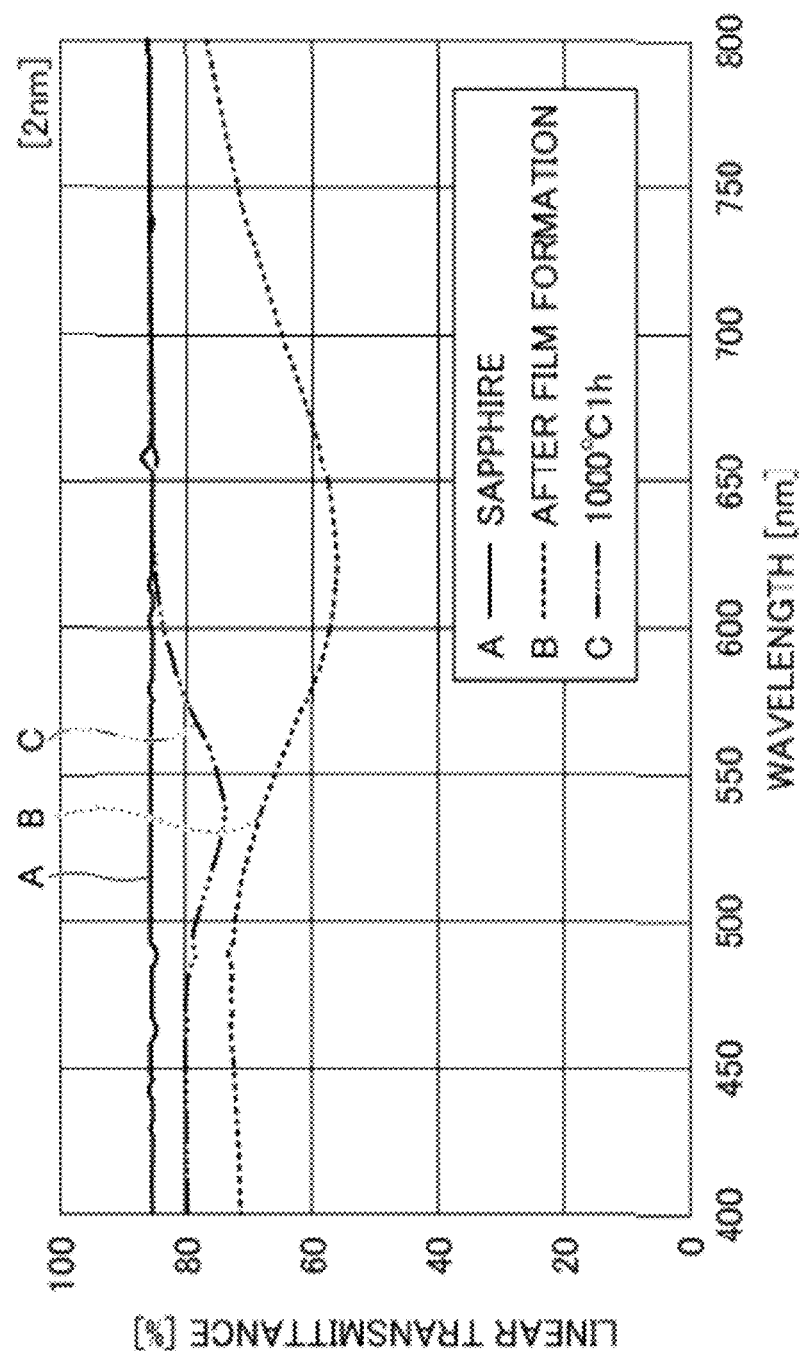
FIG. 11 is a diagram exemplifying a change in linear transmittance before and after heating of the metal film having the thickness of 2 nm.
Figure 12:
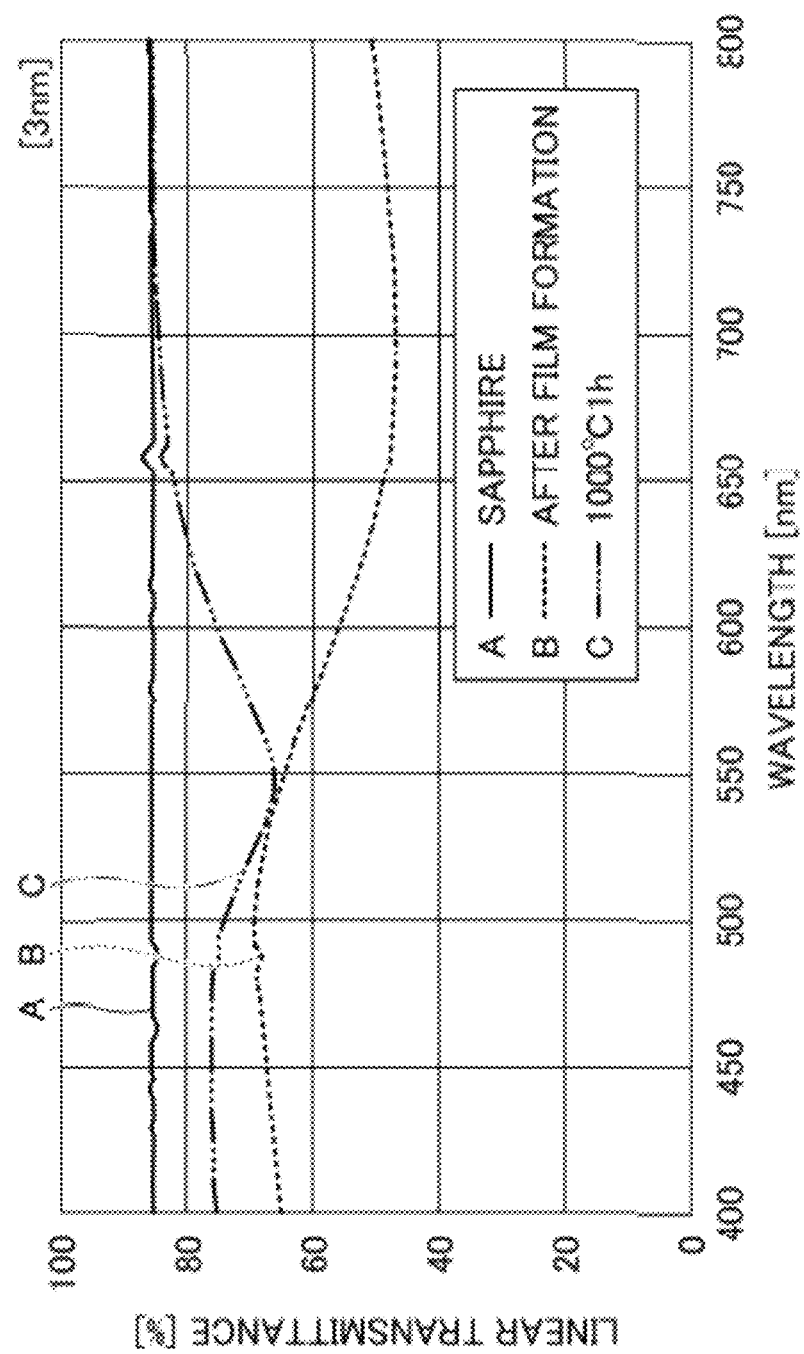
FIG. 12 is a diagram exemplifying a change in linear transmittance before and after heating of the metal film having the thickness of 3 nm.
Figure 13:
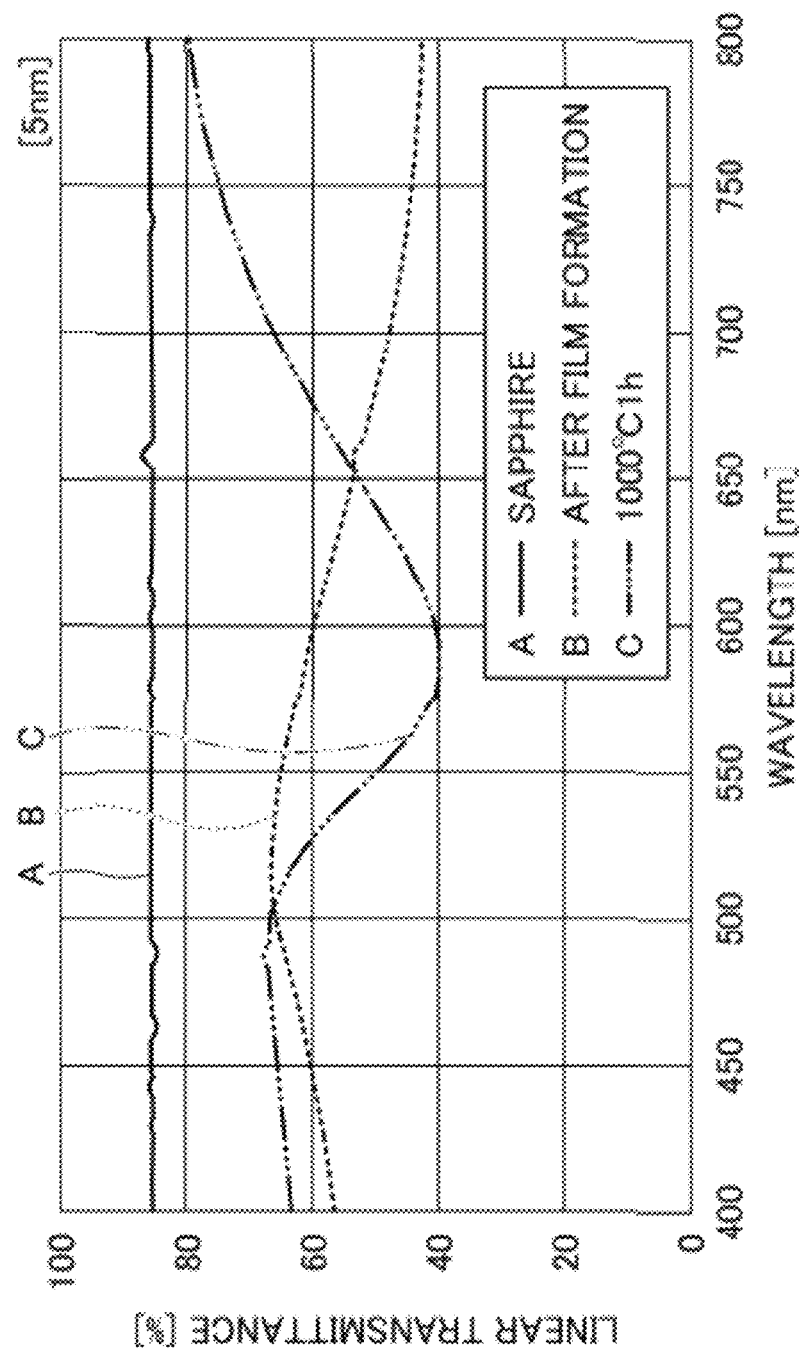
FIG. 13 is a diagram exemplifying a change in linear transmittance before and after heating of the metal film having the thickness of 5 nm.

FIGS. 10 to 13 are diagrams exemplifying changes in linear transmittance before and after heating of metal films with different thicknesses, respectively. In the examples herein, gold is used as the metal that forms the metal film. FIG. 10 is a diagram exemplifying a change in linear transmittance before and after heating of the metal film having the thickness of 1 nm. FIG. 11 is a diagram exemplifying a change in linear transmittance before and after heating of the metal film having the thickness of 2 nm. FIG. 12 is a diagram exemplifying a change in linear transmittance before and after heating of the metal film having the thickness of 3 nm. FIG. 13 is a diagram exemplifying a change in linear transmittance before and after heating of the metal film having the thickness of 5 nm.

In FIGS. 10 to 13, the measurement samples are obtained by forming with metal films (gold films) having different predetermined thicknesses (1 nm, 2 nm, 3 nm, and 5 nm), respectively, on one side of a plate-shaped sapphire having a thickness of approximately 400 μm both sides of which are mirror-finished. The linear transmittances of the samples having different metal thicknesses before and after heating were measured, and are illustrated in FIGS. 10 to 13, respectively. In FIGS. 10 to 13, "sapphire" indicates the linear transmittance of the sapphire on which no metal film is formed, and "after film formation" indicates the linear transmittance of the sample before heating. The heating conditions are 1000° C. for 1 hour under air atmosphere and atmospheric pressure.

As shown in FIGS. 10 to 13, with any thickness of 1 nm, 2 nm, 3 nm, and 5 nm, the transmittance bottom wavelength of the metal region after heating (distributed particulate metal) shifts to the short wavelength side as compared with that of the metal region before heating (film-like metal), and the transmittance bottom wavelength of the metal region after heating is within the wavelength range of 500 nm to 600 nm. The greater a thickness of the metal film before heating, the greater an amount of shift of the transmittance bottom wavelength of the metal region to the short wavelength side after heating with reference to before heating tends to be.

For example, when the metal film has the thickness of 1 nm before heating, the transmittance bottom wavelength of the metal region before heating is approximately 580 nm as indicated by B in FIG. 10, and the transmittance bottom wavelength of the metal region after heating is approximately 530 nm as indicated by C in FIG. 10, so that the amount of shift of the transmittance bottom wavelength to the short wavelength side is approximately 50 nm. When the metal film has the thickness of 2 nm before heating, the transmittance bottom wavelength of the metal region before heating is approximately 620 nm as indicated by B in FIG. 11, and the transmittance bottom wavelength of the metal region after heating is approximately 530 nm as indicated by C in FIG. 11, so that the amount of shift of the transmittance bottom wavelength to the short wavelength side is approximately 90 nm. When the metal film has the thickness of 3 nm before heating, the transmittance bottom wavelength of the metal region before heating is approximately 700 nm as indicated by B in FIG. 12, and the transmittance bottom wavelength of the metal region after heating is approximately 540 nm as indicated by C in FIG. 12, so that the amount of shift of the transmittance bottom wavelength to the short wavelength side is approximately 160 nm. When the metal film has the thickness of 5 nm before heating, the transmittance bottom wavelength of the metal region before heating is 800 nm or greater as indicated by B in FIG. 13, and the transmittance bottom wavelength of the metal region after heating is approximately 580 nm as indicated by C in FIG. 13, so that the amount of shift of the transmittance bottom wavelength to the short wavelength side is 220 nm or greater.

The greater a thickness of the metal region before heating, the smaller the linear transmittance at the transmittance bottom wavelength of the metal region after heating, that is, the bottom transmittance tends to. For example, as indicated by A in FIG. 10, the linear transmittance of sapphire is approximately 85%, and as indicated by A and C in FIG. 10, when the metal film has the thickness of 1 nm before heating, the bottom transmittance of the sapphire with the metal region after heating is approximately 79%, and thus the bottom transmittance of the metal region after heating is approximately 93%, and the pseudo bottom transmittance is approximately 94%. As indicated by A and C in FIG. 11, when the metal film has the thickness of 2 nm before heating, the bottom transmittance of sapphire on which the metal region is formed after heating is approximately 73%, and thus the bottom transmittance of the metal region after heating is approximately 86%, and the pseudo bottom transmittance is approximately 88%. As indicated by A and C in FIG. 12, when the metal film has the thickness of 3 nm before heating, the bottom transmittance of sapphire on which the metal region is formed after heating is approximately 66%, and thus the bottom transmittance of the metal region after heating is approximately 78%, and the pseudo bottom transmittance is approximately 81%. As indicated by A and C in FIG. 13, when the metal film has the thickness of 5 nm before heating, the bottom transmittance of sapphire on which the metal region is formed after heating is approximately 40%, and thus the bottom transmittance of the metal region after heating is approximately 47%, and the pseudo bottom transmittance is approximately 55%.

In addition, the greater a thickness of the metal film before heating, the greater the full width at half maximum of the bottom transmittance tends to be. For example, as indicated by A and C in FIG. 10, when the metal film before heating has the thickness of 1 nm, the full width at half maximum of the bottom transmittance or the pseudo bottom transmittance of the metal region after heating is approximately 70 nm. As indicated by A and C in FIG. 11, when the metal film has the thickness of 2 nm before heating, the full width at half maximum of the bottom transmittance or the pseudo bottom transmittance of the metal region after heating is approximately 70 nm. As indicated by A and C in FIG. 12, when the metal film has the thickness of 3 nm before heating, the full width at half maximum of the bottom transmittance or the pseudo bottom transmittance of the metal region after heating is approximately 80 nm. As indicated by A and C in FIG. 13, when the metal film has the thickness of 5 nm before heating, the full width at half maximum of the bottom transmittance or the pseudo bottom transmittance of the metal region after heating is approximately 140 nm.

Thus, by heating the metal film, a metal that forms the metal region is rendered into a particulate form. In the metal region after heating, the transmittance bottom wavelength shifts to the short wavelength side with respect to the metal region before heating, which allows the transmittance bottom wavelength of the metal region after heating to be within a predetermined wavelength range. In addition, the amount of shift of the transmittance bottom wavelength to the short wavelength side and the full width at half maximum of the bottom transmittance can be selected by selecting the thickness of the metal film before heating. Using these characteristics allows for shifting the chromaticity point of the light emitted from the emission surface of the light-transmissive member 10, as will be described below.

For example, in the light-transmissive member 10 illustrated in FIG. 1 and the like, when gold is used as the metal that forms the metal region 15, the gold is rendered into a particulate form by the heating step, and the transmittance bottom wavelength is within the wavelength range of 500 nm to 600 nm. In this case, when the light having a wavelength range of 400 nm to 760 nm enters from the lower surface 11b side of the light transmitting portion 11, a light in the wavelength range of 500 nm to 600 nm included in the entering light is primarily absorbed.

Accordingly, the ratio of light in the wavelength range of 500 nm to 600 nm in the entire light in the wavelength range of 400 nm to 760 nm decreases. Therefore, the chromaticity point of the light emitted from the emission surface of the light-transmissive member 10 can be shifted to the long wavelength side with respect to the chromaticity point when the metal region 15 is not formed. In other words, the light-transmissive member 10 can emit light having an adjusted chromaticity.

Additionally, in the light-transmissive member 10 illustrated in FIG. 1, etc., the light transmitting portion 11 may be a wavelength conversion portion including YAG as a phosphor, and a laser beam having an emission peak wavelength in a range of 420 nm to 480 nm may enter from the lower surface 11b side of the light transmitting portion 11. In this case, white light is incident on the incident surface of the metal region 15 (or white light is emitted from the surface in which the metal region 15 is formed), and the metal region 15 mainly absorbs light in the wavelength range of 500 nm to 600 nm (green component) contained in the incident light. On the other hand, many of blue components and many of red components pass through the metal region 15, and thus the green component in the white light is reduced, so that light emitted from the emission surface of the light-transmissive member 10 (or the emission surface of the metal region 15) can be adjusted to a reddish light.

In particular, when the metal film has a thickness in a range of 1 nm to 3 nm, the amount of shift of the transmittance bottom wavelength to the short wavelength side caused by heating is increased, the full width at half maximum of the bottom transmittance is also an appropriate value, and a large amount of light in the wavelength range of 500 nm to 600 nm is absorbed. Therefore, setting the thickness of the metal film to a range of 1 nm to 3 nm is preferable for obtaining reddish white light.

The transmittance bottom wavelength and the full width at half maximum of the bottom transmittance varies according to the thickness of the metal film before heating. Thus, by varying the thickness of the metal film before heating, the color of light emitted from the emission surface of the light-transmissive member 10 (the emission surface of the metal region 15) can be changed.

When the light transmitting portion 11 is a wavelength conversion portion including a phosphor and a laser beam is incident on the light transmitting portion 11, the chromaticity point of the light emitted from the light-transmissive member 10 can be adjusted on a straight line connecting the chromaticity point of the laser beam and the chromaticity point of the emission color of the phosphor on the chromaticity diagram. When adjustment of the chromaticity point by light absorption of the metal region 15 is added, the chromaticity can be adjusted even in an area not on the straight line described above, and the degree of freedom in adjusting the chromaticity point can be improved.

When forming the light transmitting portion 11 of a sintered body, heat treatment is performed, and accordingly it is conceivable that the light transmitting portion 11 is formed without using a phosphor that is vulnerable to heat. For example, when the phosphor used for the light transmitting portion 11 is composed of only YAG, it is conceivable to increase the amount of Ce and the amount of Gd contained in the phosphor for shifting the chromaticity point to the long wavelength side. On the other hand, when increasing the amount of Ce and the amount of Gd contained in the phosphor, the linearity of the temperature characteristic of the wavelength conversion portion may be impaired. For example, the temperature characteristic is linear in the low temperature region but change to non-linear in the high temperature region. With such change in the characteristic, control of the output may be difficult. In contrast, when the chromaticity point is shifted to the long wavelength side using the absorption of the metal region 15, it is possible to adjust the chromaticity point without impairing the linearity of the temperature characteristics of the wavelength conversion portion.

In addition, when the metal forming the metal region 15 is in a particulate form, the particulate form of metal scatters the incident laser beam. Therefore, in the light emitted from the emission surface of the light-transmissive member 10 (the emission surface of the metal region 15), a portion with color of the laser beam (e.g., blue) is attenuated, which allows for reducing unevenness in color and/or unevenness in brightness of the light emitted from the emission surface.

Heating the metal film to obtain a particulate form of a metal is not essential for forming the metal region 15. For example, in FIG. 10 or 11, the metal film before heating also has a transmittance bottom wavelength at the predetermined wavelength, and also has a full width at half maximum of the predetermined bottom transmittance. Therefore, even with the use of the metal film before heating illustrated in FIG. 10 or FIG. 11, the ratio of light in the predetermined wavelength range is reduced, and the chromaticity point of the light emitted from the emission surface of the light-transmissive member 10 can be shifted with respect to the chromaticity point when the metal film is not formed. When there is a demand for shifting the transmittance bottom wavelength to the short wavelength side or narrow the full width at half maximum of the bottom transmittance, it is effective to heat the metal film to obtain a particulate form of a metal.

First Modified Example of First Embodiment

In a first modified example of the first embodiment, an example of a light-transmissive member having a light-transmissive protective film covering the metal film will be described. In the first modified example of the first embodiment, the description of the same components as those of the first embodiment may be omitted.

Figure 14:
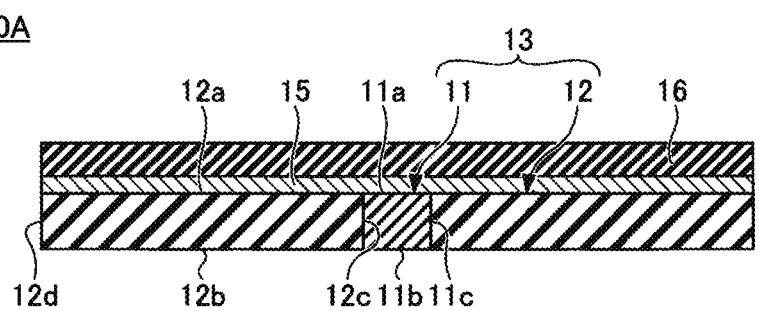
FIG. 14 is a schematic cross-sectional view exemplifying a light-transmissive member according to a first modified example of the first embodiment.

FIG. 14 is a schematic cross-sectional view exemplifying the light-transmissive member according to the first modified example of the first embodiment. As illustrated in FIG. 14, a light-transmissive member 10A includes the composite member 13, the metal region 15, and a protective film 16. In other words, the light-transmissive member 10A differs from the light-transmissive member 10 (see FIGS. 1, 2, etc.) in that the protective film 16 is formed on the emission surface side of the metal region 15.

Protective Film 16

The protective film 16 is a light-transmissive film. In other words, the protective film 16 has a transmittance of 80% or greater for incident light. The protective film 16 preferably has a transmittance of 90% or greater, and more preferably 95% or greater, for incident light. The protective film 16 has a thickness in a range of, for example, 10 nm to 100 nm. With a thickness of 10 nm or greater, the protective film 16 can sufficiently protect the object. With a thickness of 100 nm or less, the protective film 16 can have sufficiently high transmittance for incident light.

Examples of the protective film 16 include a silicon oxide film. For the protective film 16, aluminum oxide, magnesium oxide, zirconium oxide, or the like may be used in place of the silicon oxide film.

Light-Transmissive Member 10A

In the light-transmissive member 10A, the protective film 16 is formed on the emission surface of the metal film 15. The thickness of the protective film 16 is preferably greater than the thickness of the metal region 15 or the maximum length of the metal region 15 in the direction perpendicular to the emission surface. In the light-transmissive member 10A, the upper surface 11a side of the light transmitting portion 11 on which the metal region 15 and the protective film 16 are formed is the light emitting side, and the lower surface 11b side of the light transmitting portion 11 is the light incident side. In other words, light incident on the light transmitting portion 11 is emitted via the metal region 15 and the protective film 16.

In order to form the protective film 16, for example, in the step of forming the metal film of the first embodiment, a protective film is further disposed on the metal film provided on the emission surface of the light transmitting portion 11 and heated. When the protective film 16 is, for example, a silicon oxide film, in the step of forming the protective film 16, a silicon film is disposed as the protective film 16 and heated. The silicon film reacts with oxygen in the atmosphere during heating to become a light-transmissive silicon oxide film.

Figure 15:
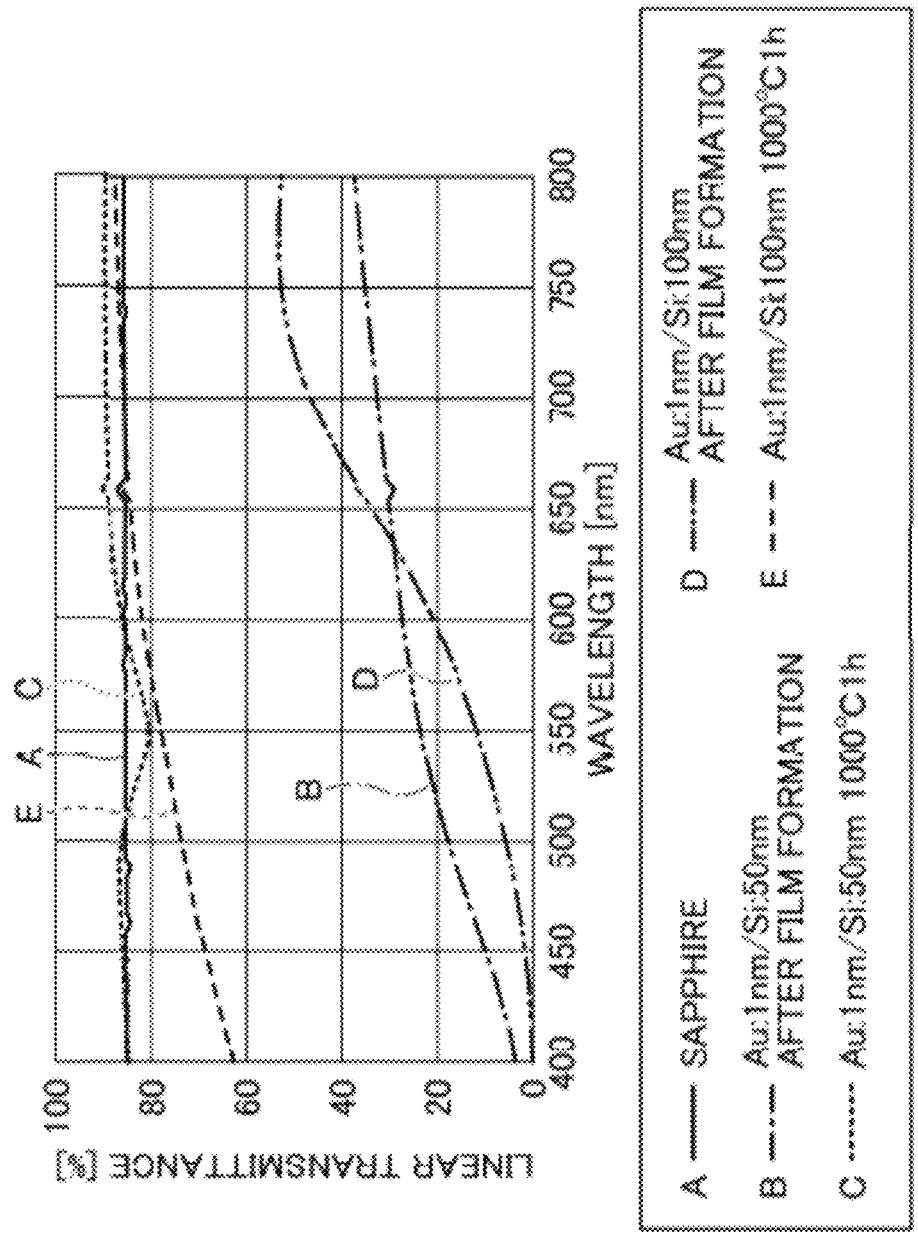
FIG. 15 is a diagram exemplifying a change in linear transmittance between before and after heating when a protective film is formed on a metal film having a thickness of 1 nm.
Figure 16:
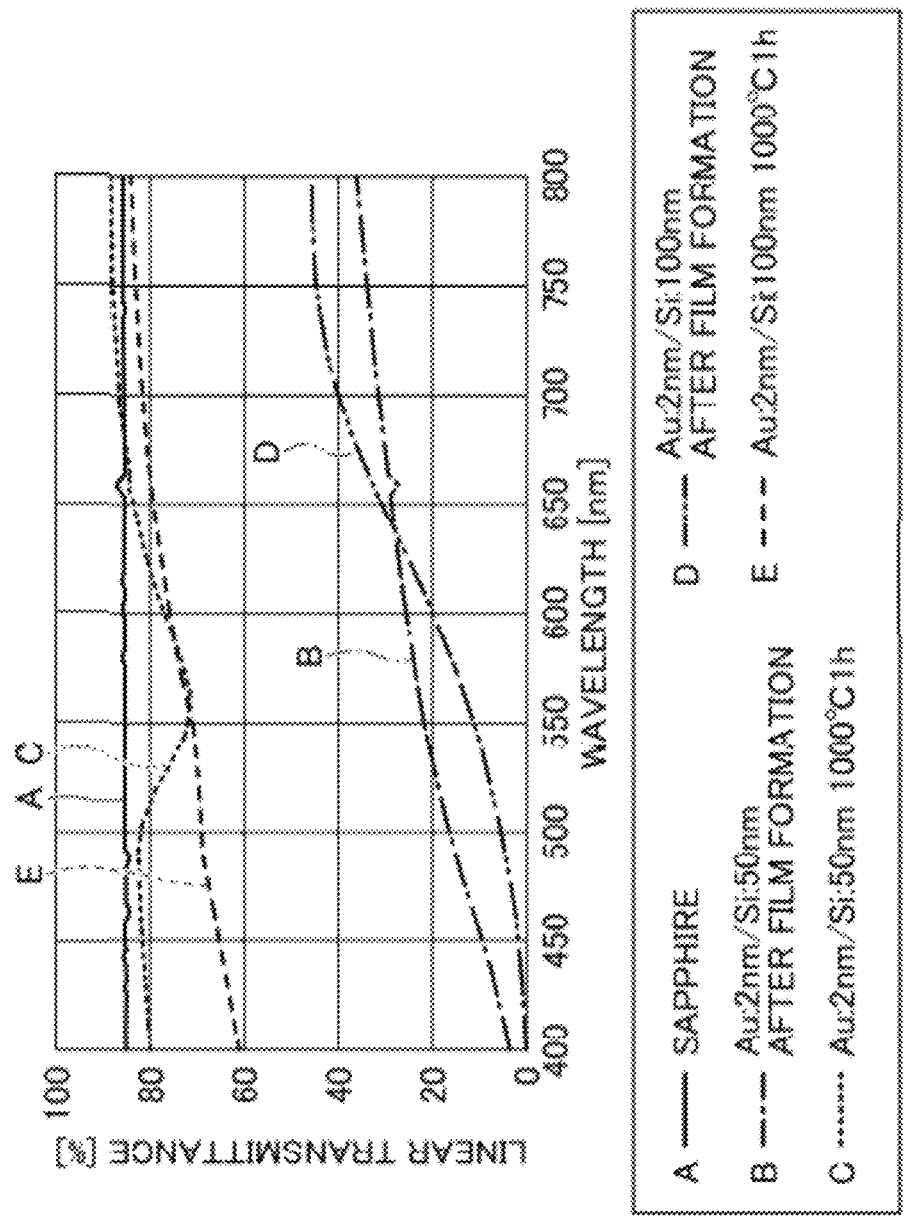
FIG. 16 is a diagram exemplifying a change in linear transmittance between before and after heating when a protective film is formed on a metal film having a thickness of 2 nm.

FIGS. 15 and 16 exemplify changes in linear transmittance before and after heating of protective films having different thicknesses, respectively. In the example herein, gold is used as the metal that forms the metal film and a silicon oxide film is used as the protective film after heating.

FIG. 15 is a diagram exemplifying changes in linear transmittance between before and after heating when each of the protective films is formed on a respective metal film having a thickness of 1 nm. FIG. 16 is a diagram exemplifying changes in linear transmittance between before and after heating when each of the protective films is formed on a respective metal film having a thickness of 2 nm. In FIGS. 15 and 16, the protective films, each formed on the respective metal film before heating, are silicon films having thicknesses of 50 nm and 100 nm, respectively.

In FIGS. 15 and 16, the measurement samples are plate-shaped sapphires having a thickness of approximately 400 μm with metal films (gold films) having predetermined film thicknesses (1 nm and 2 nm, respectively), each metal film formed on one of two opposite mirror-finished surfaces of a respective one of the plate-shaped sapphires, and protective films (silicon films) having predetermined film thicknesses (50 nm and 100 nm, respectively), each protective film formed on a respective one of the metal films. The linear transmittances before and after heating of the metal films and the protective films were measured for the respective samples having different thicknesses of the metal films and the protective films, and are shown in FIGS. 15 and 16. The heating conditions are 1000° C. for 1 hour under air atmosphere and atmospheric pressure.

As shown in FIGS. 15 and 16, irrespective of the thicknesses of the metal films, the linear transmittances of the metal films with the protective films are low before heating, but those after heating are almost the same as the linear transmittances of the metal films without the protective films shown in FIGS. 10 and 11. This is because the silicon film forming the protective film reacts with oxygen in the atmosphere during heating and thus becomes a light-transmissive silicon oxide film, which has a lower refractive index than sapphire. When comparing FIGS. 15 and 16 with FIGS. 10 and 11, respectively, it can be seen that the linear transmittance of the silicon oxide film, which is a protective film, is 95% or more.

It is conceivable to form a silicon oxide film on the metal film as a protective film before heating, but in this case, the silicon oxide film may be cracked or peeled off by heating. Such a problem can be avoided by forming the silicon film on the metal film as the protective film and heating the silicon film to obtain the silicon oxide film.

In addition, by forming the silicon film on the metal film and heating the formed silicon film, the metal can be intentionally diffused into the silicon film. Accordingly, uniformity of the particle size of the particulate form of metal in the metal region can be increased.

As described above, with the light-transmissive protective film 16 covering the metal region 15, the metal region 15 can be protected without impairing light transmissivity of the light-transmissive member 10A, so that the light-transmissive member 10A can be prevented from being detached from the composite member 13 or being damaged.

Second Modified Example of First Embodiment

In a second modified example of the first embodiment, an example of a light-transmissive member having a structure different from that of the first embodiment will be described. In the second modified example of the first embodiment, the description of the same components as those of the embodiment described above may be omitted.

Figure 17:
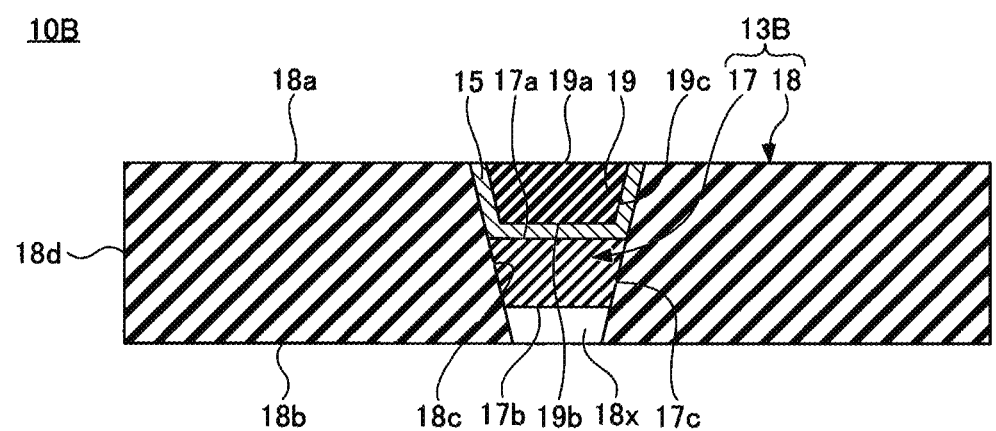
FIG. 17 is a schematic cross-sectional view exemplifying a light-transmissive member according to a second modified example of the first embodiment.

FIG. 17 is a schematic cross-sectional view exemplifying a light-transmissive member according to a second modified example of the first embodiment. As illustrated in FIG. 17, a light-transmissive member 10B includes a composite member 13B, the metal region 15, and a second light transmitting portion 19.

Composite Member 13B

The composite member 13B includes a light transmitting portion 17 and a light reflecting portion 18. The light reflecting portion 18 is not an essential component and is employed when necessary.

The material and function of the light transmitting portion 17 is the same as those of the light transmitting portion 11, but a shape of the light transmitting portion 17 is different from the shape of the light transmitting portion 11. The light transmitting portion 17 has an upper surface 17a, a lower surface 17b opposite to the upper surface 17a, and a lateral surface 17c meeting the upper surface 17a and the lower surface 17b. The lateral surface 17c connects an outer edge of the upper surface 17a and an outer edge of the lower surface 17b.

The light transmitting portion 17 has, for example, an inverted truncated cone shape. In this case, in the light transmitting portion 17, the upper surface 17a has a circular shape, the lower surface 17b has a circular shape with a smaller diameter than that of the upper surface 17a, and the lateral surface 17c is a single curved surface.

The material and function of the light reflecting portion 18 is the same as those of the light reflecting portion 12, but a shape of the light reflecting portion 18 is different from the shape of the light reflecting portion 12. The light reflecting portion 18 is, for example, a frame-shaped member defining an opening. The light reflecting portion 18 has an upper surface 18a, a lower surface 18b opposite to the upper surface 18a, an inner lateral surface 18c that connects an inner edge of the upper surface 18a and an inner edge of the lower surface 18b, and an outer lateral surface 18d that connects an outer edge of the upper surface 18a and an outer edge of the lower surface 18b.

The opening of the light reflecting portion 18 is, for example, a through hole defining an inverted truncated cone shape. In this case, in the light reflecting portion 18, the inner edge of the upper surface 18a has a circular shape, the inner edge of the lower surface 18b has a circular shape with a smaller diameter than that of the inner edge of the upper surface 18a, and the inner lateral surface 18c is a single curved surface. The outer edges of each of the upper surface 18a and the lower surface 18b of the light reflecting portion 18 define, for example, a rectangular shape. In this case, the light reflecting portion 18 has four outer lateral surfaces 18d each having a rectangular shape.

In the composite member 13B, the light reflecting portion 18 is thicker than the light transmitting portion 17, and the light transmitting portion 17 is disposed in the vicinity of the center of the opening of the light reflecting portion 18 in the thickness direction. The light transmitting portion 17 is fixed to the inner lateral surface 18c of the light reflecting portion 18 with, for example, a light-transmissive adhesive. For the light-transmissive adhesive, for example, glass can be used. In the opening of the light reflecting portion 18, a space 18x is defined below the light transmitting portion 17.

Second Light Transmitting Portion 19

The second light transmitting portion 19 has an upper surface 19a, a lower surface 19b that is an opposite surface of the upper surface 19a, and a lateral surface 19c meeting the upper surface 19a and the lower surface 19b. The lateral surface 19c connects an outer edge of the upper surface 19a and an outer edge of the lower surface 19b.

The second light transmitting portion 19 has, for example, an inverted truncated cone shape. In this case, in the second light transmitting portion 19, the upper surface 19a has a circular shape, the lower surface 19b has a circular shape with a smaller diameter than that of the upper surface 19a, and the lateral surface 19c is a single curved surface. The second light transmitting portion is formed of a light-transmissive material. Examples of a material of the second light transmitting portion include glass.

Light-Transmissive Member 10B

The light-transmissive member 10B has the same function as the light-transmissive member 10, but has a shape different from that of the light-transmissive member 10. The metal region 15 is formed on the upper surface 17a of the light transmitting portion 17 and on a portion of the inner lateral surface 18c of the light reflecting portion 18 above the light reflecting portion 17. Further, the metal region 15 is in contact with the lower surface 19b and the lateral surface 19c of the second light transmitting portion 19.

In the light-transmissive member 10B, the upper surface 17a side of the light transmitting portion 17 on which the metal region 15 is formed serves as the light emitting side, and the lower surface 17b side of the light transmitting portion 17 serves as the light incident side. The light incident on the light transmitting portion 17 is emitted via the metal region 15 and further via the second light transmitting portion 19. A portion of light may also be incident on the lower surface 18b of the light reflecting portion 18. The second light transmitting portion 19 functions to enhance the strength of the light-transmissive member 10B.

In the light reflecting portion 18, light traveling from the light transmitting portion 17 toward the light reflecting portion 18 is reflected at the inner lateral surface 18c. The "light traveling from the light transmitting portion 17 toward the light reflecting portion 18" is light incident on the light transmitting portion 17. When the light transmitting portion 17 is a wavelength conversion portion containing a phosphor, in the light reflecting portion 18, light incident on the light transmitting portion 17 or light whose wavelength is converted by the light transmitting portion 17 is reflected at the inner lateral surface 18c.

Method of Manufacturing Light-Transmissive Member 10B

In order to manufacture the light-transmissive member 10B, the composite member 13B is provided. The composite member 13B can be provided, for example, by manufacturing from the light transmitting portion 17 and the light reflecting portion 18. More specifically, for example, the light reflecting portion 18 having the truncated cone-shaped opening is provided, and the lateral surface 17c of the light transmitting portion 17 is bonded to the inner lateral surface 18c of the light reflecting portion 18 via a light-transmissive adhesive. For example, glass is used for the light-transmissive adhesive, and the lateral surface 17c of the light transmitting portion 17 to the inner lateral surface 18c of the light reflecting portion 18 are fuse-bonded together. Alternatively, instead of manufacturing the composite member 13B, the composite member 13B may be provided by purchasing.

Subsequently, a metal film is formed on the upper surface 17a of the light transmitting portion 17, a portion of the inner lateral surface 18c of the light reflecting portion 18 above the light transmitting portion 17, and the upper surface 18a of the light reflecting portion 18. Examples of a metal that forms the metal film include gold. The metal film can be formed by, for example, sputtering. At this time, the metal film is formed continuously rather than in the form of particles.

After forming the metal film, the metal film is heated. By performing the step of heating the metal film, the metal contained in the metal film are rendered into a particulate form. That is, through the step of heating the metal film, the metal region 15 containing a particulate form of metal is formed. By performing the step of heating the metal film, a metal contained in the metal film is rendered into a particulate form such that, for example, the ratio of the area dimension occupied by the particulate metal substance in a region where the metal region 15 is formed to the area dimension of the region where the metal region 15 is formed is in a range of 10% to 60%.

Subsequently, a light-transmissive material (for example, glass) to become the second light transmitting portion 19 is disposed on the metal region 15 located in the opening of the light reflecting portion 18. Then, the light-transmissive material is heated to fuse, and then cured to obtain the second light transmitting portion 19. At this time, the second light transmitting portion 19 protrudes upward with respect to the metal region 15 covering the upper surface 18a of the light reflecting portion 18.

Subsequently, the second light transmitting portion 19 that protrudes upward with respect to the metal region 15 covering the upper surface 18a of the light reflecting portion 18, and the metal region 15 covering the upper surface 18a of the light reflecting portion 18 are polished to be removed, so that the upper surface 18a side of the light reflecting portion 18 is made flat. The upper surface 18a of the light reflecting portion 18 is, for example, flush with the upper surface of the second light transmitting portion 19. Thus, the light-transmissive member 10B is obtained.

Also, in the light-transmissive member 10B, heating the metal film causes a metal that forms the metal film to render into a particulate form. In the metal region after heating, the transmittance bottom wavelength is shifted to a short wavelength side with respect to the metal region before heating, which allows the transmittance bottom wavelength of the metal region after heating to be within a predetermined wavelength range. In addition, the amount of shift of the transmittance bottom wavelength to the short wavelength side and the full width at half maximum of the bottom transmittance can be selected by selecting a thickness of the metal film before heating. With the use of these characteristics, similarly to the light-transmissive member 10, the chromaticity point of the light emitted from the emission surface of the light-transmissive member 10B can be shifted. In the light-transmissive member 10B, the metal region 15 is not formed on the upper surface 18a of the light reflecting portion 18, and thus light with a shifted chromaticity point can be emitted only in the second light transmitting portion 19.

Second Embodiment

In a second embodiment, an example of an optical member that employs the light-transmissive member according to the first embodiment will be described. In the second embodiment, the description of the same components as those of the embodiment described above may be omitted.

Figure 18:
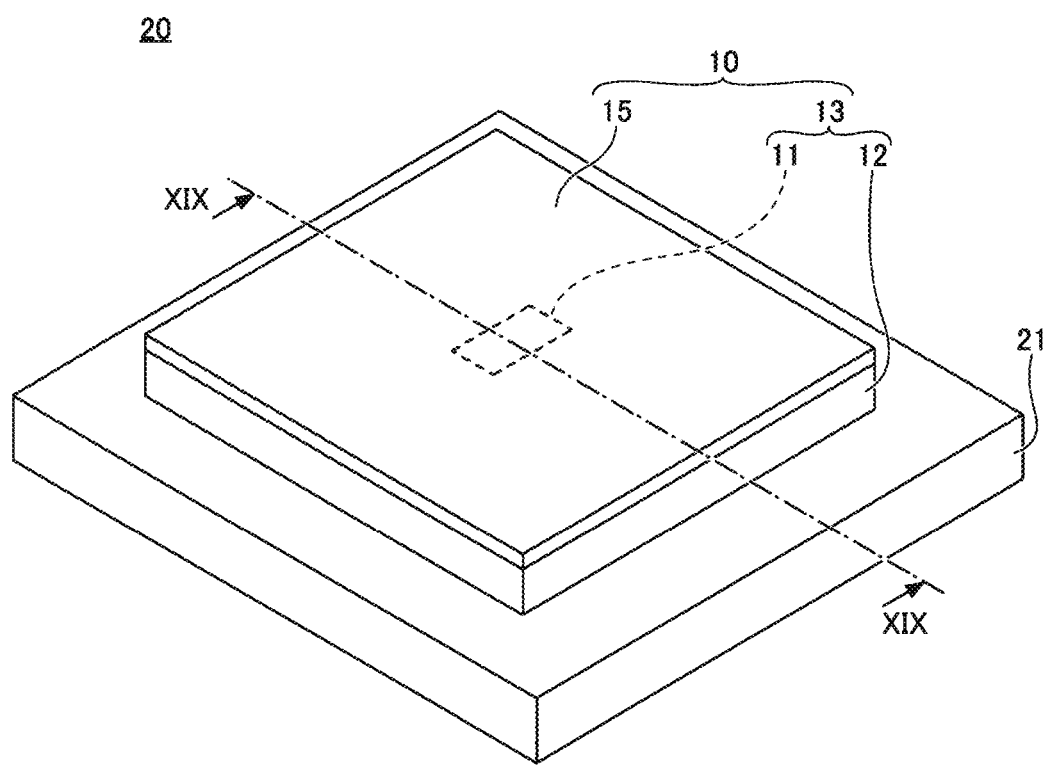
FIG. 18 is a schematic perspective view exemplifying an optical member according to a second embodiment.
Figure 19:
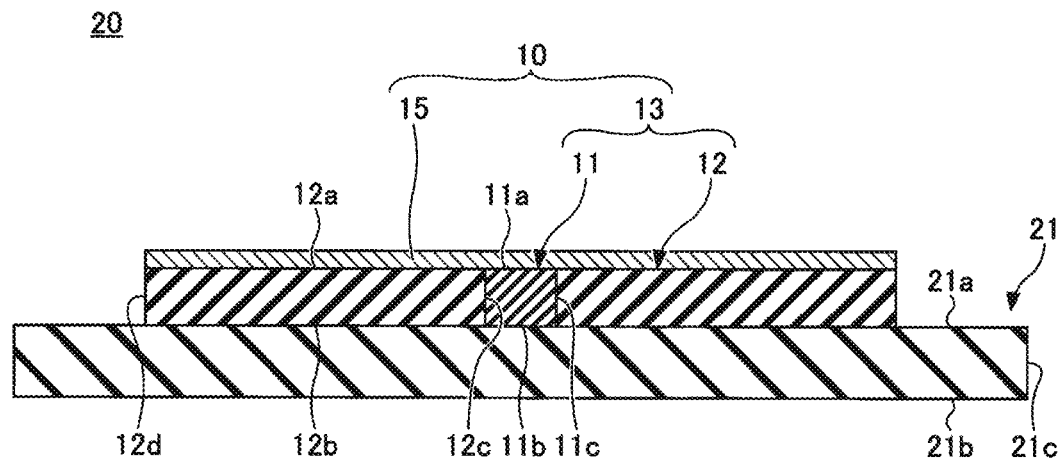
FIG. 19 is a schematic cross-sectional view taken along line XIX-XIX of FIG. 18 exemplifying the optical member according to the second embodiment.

FIG. 18 is a schematic perspective view exemplifying the optical member according to the second embodiment. FIG. 19 is a schematic cross-sectional view taken along line XIX-XIX in FIG. 18 exemplifying the optical member according to the second embodiment. As illustrated in FIGS. 18 and 19, an optical member 20 includes the light-transmissive member 10 and a plate-shaped member 21.

Components of the optical member 20 will be described.
Plate-Shaped Member 21

The plate-shaped member 21 is a light-transmissive member. The plate-shaped member 21 has an upper surface 21a, a lower surface 21b opposite the upper surface 21a, and lateral surfaces 21c meeting the upper surface 21a and the lower surface 21b. Each of the lateral surfaces 21c connects a corresponding outer edge of the upper surface 21a and a corresponding outer edge of the lower surface 21b. The plate-shaped member 21 has, for example, a rectangular parallelepiped shape or a cubic shape. In this case, both the upper surface 21a and the lower surface 21b of the plate-shaped member 21 have a rectangular shape, and the plate-shaped member 21 has four lateral surfaces 21c, each having a rectangular shape.

However, the plate-shaped member 21 may have a shape other than a rectangular parallelepiped shape or a cubic shape. In other words, a planar shape of the plate-shaped member 21 is not necessarily a rectangular shape, but may have any appropriate shape such as a circular shape, an elliptic shape, or a polygonal shape.

The plate-shaped member 21 can be formed using sapphire as a main material. Sapphire is a material with relatively high transmittance and relatively high strength. Note that the main material can also be selected from light-transmissive materials other than sapphire, such as quartz, silicon carbide, and glass.

Optical Member 20

In the optical member 20, a surface of the light-transmissive member 10 on which the metal region 15 is not formed is bonded to the upper surface 21a of the plate-shaped member 21. In other words, the plate-shaped member 21 is disposed on the lower surface 11b side of the light transmitting portion 11 and the lower surface 12b side of the light reflecting portion 12. When sapphire is used as a base material of the plate-shaped member 21, because the sapphire is a material having a relatively high thermal conductivity, the heat generated in the light-transmissive member 10 can be dissipated.

The plate-shaped member 21 is adapted to transmit light, and accordingly light incident on the lower surface 21b side of the plate-shaped member 21 reaches the metal region 15 via the light transmitting portion 11 and is emitted from the metal region 15 side. Thus, the metal region 15 absorbs light in a specific wavelength range, so that the chromaticity point of the light emitted from the optical member 20 can be shifted to the long wavelength side with respect to that without the metal region 15. In other words, the optical member 20 can emit light having an adjusted chromaticity.

Third Embodiment

In a third embodiment, an example of a light emitting device employing the optical member according to the second embodiment will be described. In the third embodiment, the description of the same components as those of the embodiment described above may be omitted.

Figure 20:
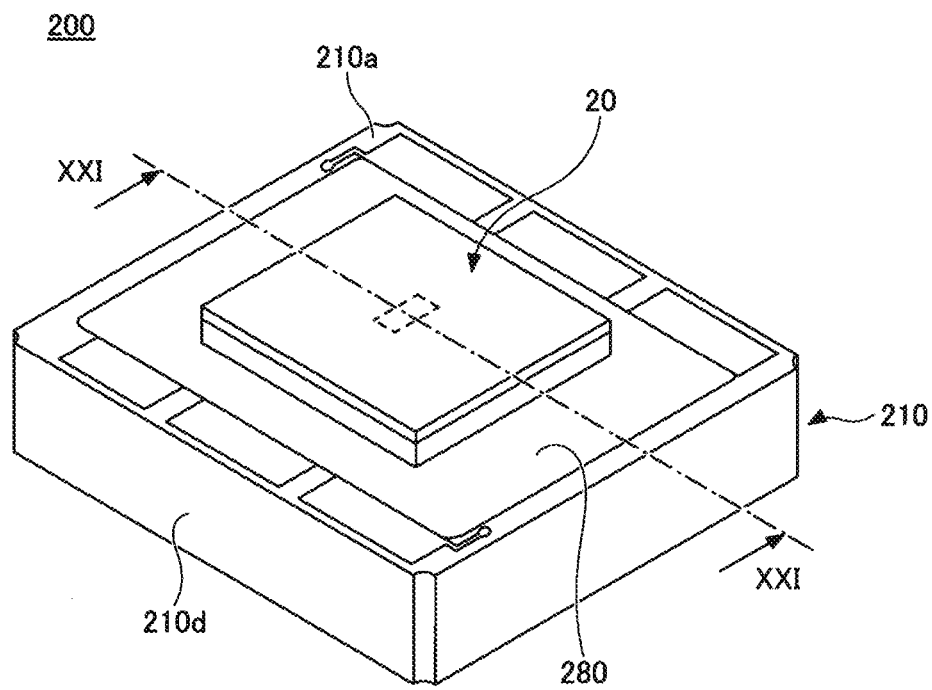
FIG. 20 is a schematic perspective view exemplifying a light emitting device according to a third embodiment.
Figure 21:
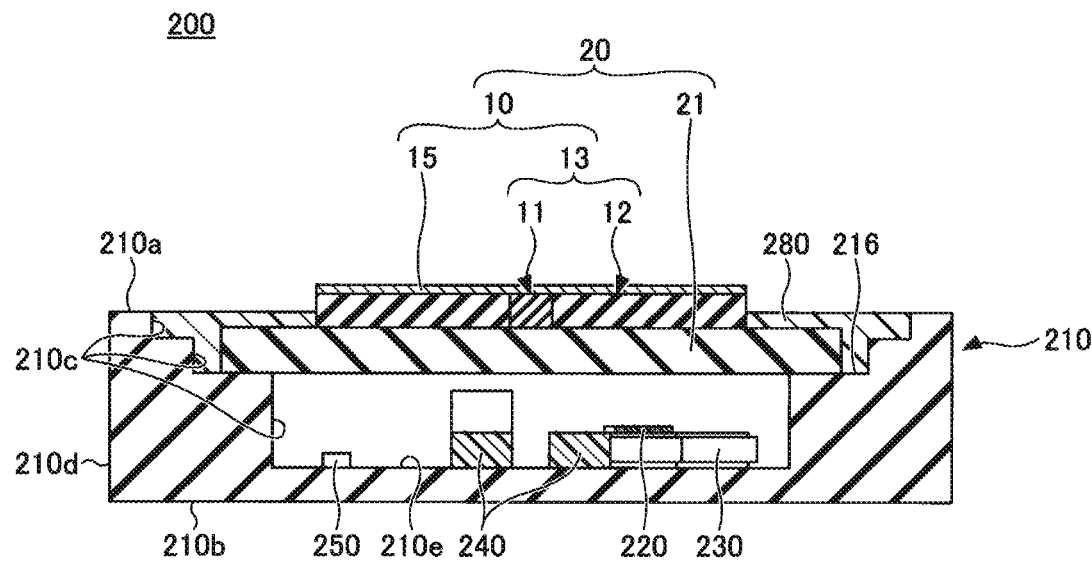
FIG. 21 is a schematic cross-sectional view taken along line XXI-XXI of FIG. 20 exemplifying the light emitting device according to the third embodiment.
Figure 22:
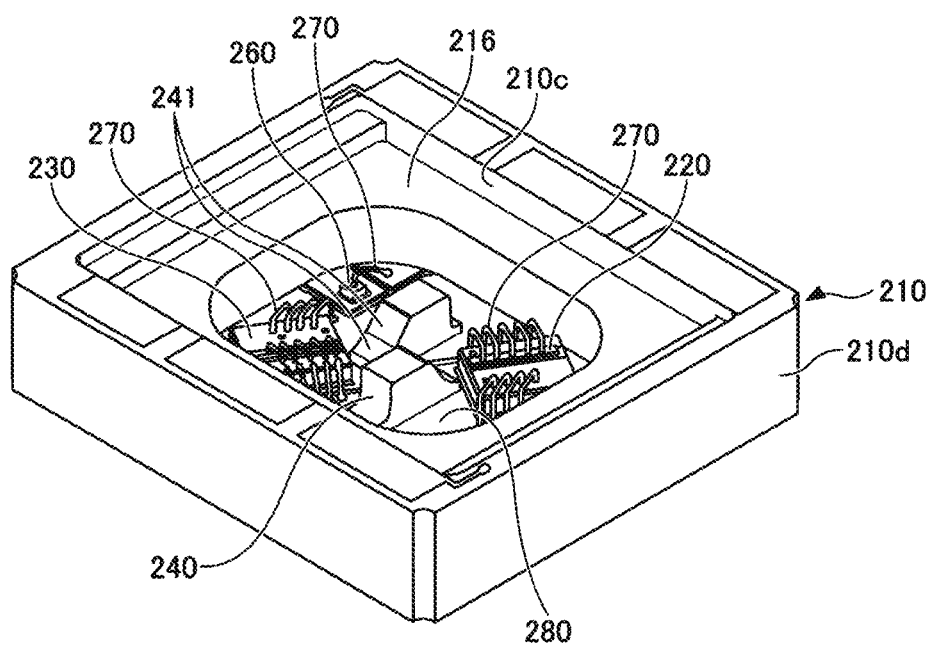
FIG. 22 is a schematic perspective view of the light emitting device according to the third embodiment in a state in which the optical member has been removed.
Figure 23:
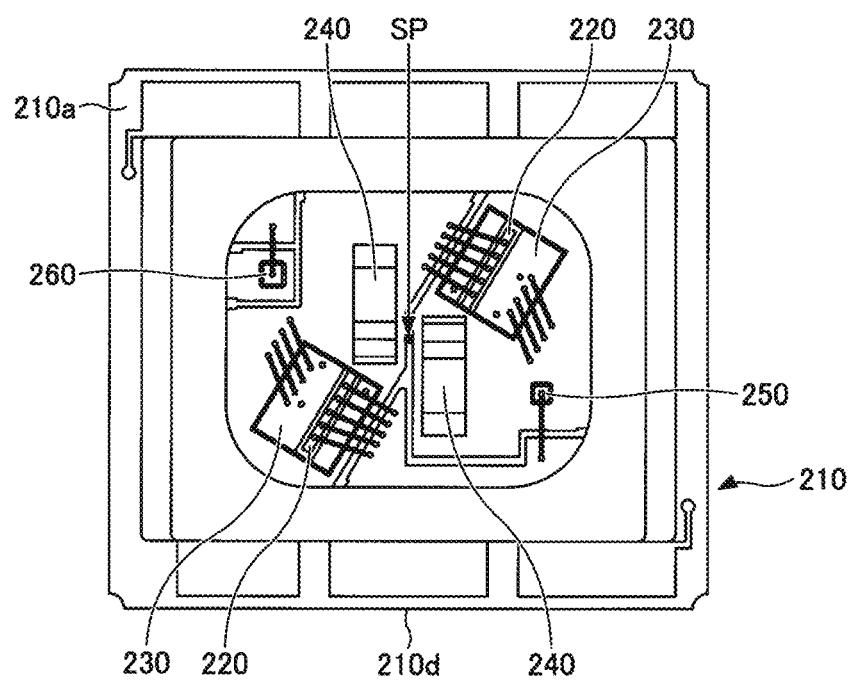
FIG. 23 is a schematic plan view of the light emitting device according to the third embodiment in the state in which the optical member has been removed.

FIG. 20 is a schematic perspective view exemplifying the light emitting device according to the third embodiment. FIG. 21 is a schematic cross-sectional view taken along line XXI-XXI of FIG. 20 exemplifying the light emitting device according to the third embodiment. FIG. 22 is a schematic perspective view of the light emitting device according to the third embodiment in a state in which the optical member is further removed. FIG. 23 is a schematic plan view of the light emitting device according to the third embodiment in a state in which the optical member is further removed.

As illustrated in FIGS. 20 to 23, a light emitting device 200 includes the optical member 20, a base portion 210, a light emitting element 220, a submount 230, a light reflecting member 240, a protective element 250, a temperature measuring element 260, a wire 270, and a light shielding member 280. The light emitting device 200 may include at least the optical member 20, the base portion 210, and the light emitting element 220. The light emitting device 200 may include the light-transmissive member 10 in place of the optical member 20.

Components of the light emitting device 200 will be described.

Base Portion 210

The base portion 210 includes an upper surface 210a, a lower surface 210b, a plurality of inner lateral surfaces 210c, one or a plurality of outer lateral surfaces 210d, and an upward-facing surface 210e. The base portion 210 defines a recess recessed in the direction from the upper surface 210a to the lower surface 210b. The base portion 210 has an outer shape of a rectangular shape in a plan view, and the recess is defined inward of an outer periphery defining the outer shape.

In addition, in a plan view, the one or the plurality of inner lateral surfaces 210c meeting the upper surface 210a forms a frame. In other words, the base portion 210 includes the upward-facing surface 210e and the frame forming the plurality of inner lateral surfaces 210c extending above the upward-facing surface 210e. The recess including the upward-facing surface 210e of the base portion 210 is surrounded by the frame.

The base portion 210 includes one or a plurality of stepped portions 216 inside the frame. Each of the one or more stepped portions 216 is constituted only of an upper surface and a lateral surface meeting the upper surface and extending downward. The one or the plurality of inner lateral surfaces 210c include lateral surfaces meeting the upward-facing surface 210e of the base portion 210 and lateral surfaces of the stepped portions 216.

The base portion 210 can be formed, for example, using a ceramic as a main material. For example, aluminum nitride, silicon nitride, aluminum oxide, or silicon carbide can be used as the ceramic. The base portion 210 may be formed using a material other than a ceramic, and may be formed using other insulating materials as a main material.

One or a plurality of metal films are disposed on the upward-facing surface 210e of the base portion 210. Also, one or a plurality of metal films are disposed on the upper surface 210a of the base portion 210. In addition, the one or the plurality of metal films on the upward-facing surface 210e contains a metal film electrically connected to the metal film on the upper surface 210a.

The frame of the base portion 210 is not necessarily located on a plane coplanar with the upward-facing surface 210e. For example, the frame of the base portion 210 may be located on a plane that is located below the upward-facing surface 210e. The base portion 210 is not necessarily integrally formed, and may be formed, for example, by bonding a frame onto a plate-shaped member.

Light Emitting Element 220

The light emitting element 220 may be any appropriate element configured to emit light. For example, a semiconductor laser element, a light emitting diode (LED), or an organic light emitting diode (OLED) can be employed. In the present embodiment, an example in which a semiconductor laser element is employed as the light emitting element 220 will be illustrated. That is, in the description below, the light emitting element 220 is a semiconductor laser element.

The light emitting element 220 has, for example, a rectangular outer shape in a plan view. A lateral surface of the light emitting element 220 that corresponds to one of two short sides of the rectangular shape in a plan view is an emission end surface through which light is emitted from the light emitting element 220. Each of an upper surface and a lower surface of the light emitting element 220 has an area larger than the emitting end surface.

Light (laser beam) emitted from the light emitting element 220 spreads and forms an elliptical far field pattern (hereinafter referred to as "FFP") on a plane parallel to the light emission end surface. As used herein, the FFP indicates a shape and a light intensity distribution of the emitted light at a position apart from the emitting end surface.

The light emitted from the light emitting element 220 forms the elliptical FFP on a plane parallel to the light emission end surface.

In the elliptical FFP, a layer direction of a plurality of semiconductor layers including an active layer is the minor axis, and a layering direction perpendicular to the layer direction is the major axis. The layer direction corresponding to the minor axis is referred to as a horizontal direction of the FFP and the layering direction corresponding to the major axis is referred to as a vertical direction of the FFP.

Based on the light intensity distribution of the FFP of the light emitting element 220, light having an intensity of $1/e^2$ times or greater of a peak intensity value is referred to as a "main portion of light." In this light intensity distribution, an angle corresponding to the full width at half maximum is referred to as a "spread angle." The spread angle of the FFP in the vertical direction is referred to as the "vertical spread angle," and the spread angle of the FFP in the horizontal direction is referred to as the "horizontal spread angle."

As the light emitting element 220, a light emitting element in which an emission peak wavelength of light emitted from the light emitting element 220 is in a range of 320 nm to 495 nm, typically in a range of 420 nm to 480 nm can be used. Examples of such a light emitting element 220 include a semiconductor laser element including a nitride semiconductor. As the nitride semiconductor, for example, GaN, InGaN, or AlGaN can be used. The light emitting element 220 may be configured to emit light having other wavelength.

Submount 230

The submount 230 has, for example, a rectangular parallelepiped shape and has a lower surface, an upper surface, and a lateral surface. The submount 230 has the smallest width in the vertical direction. The submount 230 may have a shape other than a rectangular parallelepiped shape. The submount 230 is formed using, for example, aluminum nitride or silicon carbide, although other materials may be used. A metal film is disposed on the upper surface of the submount 230.

Light Reflecting Member 240

The light reflecting member 240 has a light reflecting surface 241 that reflects light. Examples of the light reflecting surface include a surface having a light reflectance of 90% or more to the peak wavelength of the irradiated light is employed. The light reflectance here may be 100% or may be less than 100%.

The light reflecting member 240 has a plurality of light reflecting surfaces 241. Two light reflecting surfaces 241 are included in the plurality of light reflecting surfaces 241, and are both planar and inclined toward a lower surface of the light reflecting member 240 and have different inclination angles with respect to the lower surface. Neither of the two light reflecting surfaces 241 is perpendicular or parallel to the lower surface. The two light reflecting surfaces 241 are continuously connected to form a single integral reflecting region. The light reflecting surface 241 is not necessarily a flat-surface shape, and may be, for example, a curved surface shape.

For the light reflecting member 240, it is preferable to select a heat-resistant material as a main material, and for example, glass such as quartz or BK7 (borosilicate glass), metal such as aluminum, or Si can be used. The light reflecting surface can be formed using, for example, metal such as Ag or Al, or a dielectric multilayer film of $Ta_2O_5/SiO_2$, $TiO_2/SiO_2$, or $Nb_2O_5/SiO_2$. The expression "A/B" indicates a multilayer film in which a film A and a film B are layered in order.

Protective Element 250

The protective element 250 serves to prevent flow of an excessive current through specific elements such as light emitting elements and thus to prevent breakage of such specific elements. For example, a Zener diode formed of Si can be used for the protective element 250.

Temperature Measuring Element 260

The temperature measuring element 260 is an element utilized as a temperature sensor for measuring the ambient temperature. For example, a thermistor can be used for the temperature measuring element 260.

Wirings 270

The wirings 270 are used for electrical connection between two components. For example, metal wires can be used as the wirings 270.

Light Shielding Member 280

The light shielding member 280 can be formed of, for example, a light-shielding resin. As used herein, the term "light-shielding" refers to properties that do not allow light to pass through. The light-shielding properties may be implemented by utilizing property of blocking light, absorbing light, reflecting light, or the like. The light shielding member 280 can be formed of, for example, a resin with a filler made of a light diffusing material and/or a light absorbing material contained in the resin.

Examples of the resin that forms the light shielding member 280 include an epoxy resin, a silicone resin, an acrylate resin, a urethane resin, a phenol resin, and a BT resin. Examples of the light absorbing fillers contained in the light shielding member 280 include dark-colored pigments such as carbon black.

Light Emitting Device 200

In the light emitting device 200, two light reflecting members 240 are disposed on the upward-facing surface 210e of the base portion 210. The lower surfaces of the two light reflecting members 240 are each bonded to the upward-facing surface 210e of the base portion 210. The two light reflecting members 240 are disposed, for example, point-symmetrically with respect to a point SP (see FIG. 23). In a plan view, in each of the two light reflecting members 240, an upper end of the light reflecting surface 241 is parallel or perpendicular to a corresponding one of the inner lateral surfaces 210c or the outer lateral surface 210d of the base portion 210. The terms "parallel" and "perpendicular" as used herein allows a difference within ±5 degrees.

The protective element 250 and the temperature measuring element 260 are disposed on the upward-facing surface 210e of the base portion 210. The protective element 250 is disposed and bonded to a metal film on which one of the two light reflecting members 240 is disposed. The temperature measuring element 260 is disposed and bonded to a metal film different from the metal films on each of which a respective one of the two light reflecting members 240 are disposed.

Two submounts 230 are disposed on the upward-facing surface 210e of the base portion 210. The two submounts 230 are disposed on respective metal films, and lower surfaces of the submounts 230 are bonded to the upward-facing surface 210e of the base portion 210.

The light emitting elements 220 are disposed on the upward-facing surface 210e of the base portion 210. More specifically, each of the light emitting elements 220 is disposed on a corresponding one of the submounts 230. In the illustrated example of the light emitting device 200, each of the two light emitting elements 220 is disposed on the upper surface of a corresponding one of the submounts 230, and the lower surfaces of submounts 230 are bonded to the upward-facing surface 210e of the base portion 210. The two light emitting elements 220 are disposed point-symmetrically with respect to the point SP. That is, the point about which the two light emitting elements 220 are point-symmetrically arranged and the point about which the two light reflecting members 240 are point-symmetrically arranged coincides with each other. In the description below, this point SP will be referred to as a "point of symmetry."

In each of the two light emitting elements 220, the emitting end surface is neither parallel nor perpendicular to a corresponding one of the inner lateral surfaces 210c and a corresponding one of the outer lateral surfaces 210d of the base portion 210 in a plan view. Thus, each of the emission end surfaces is neither parallel nor perpendicular to the upper end of a corresponding one of the light reflecting surface 241. In other words, each of the light emitting elements 220 is arranged such that the emission end surface is oblique with respect to a corresponding one of the inner lateral surfaces 210c and a corresponding one of the outer lateral surfaces 210d of the base portion 210 and the upper end of a corresponding light reflecting surface 241 in a plan view.

Light emitted from the emission end surface of each of the two light emitting elements 220 is irradiated to a corresponding light reflecting member 240. The light emitting element 220 is arranged such that at least the main portion of light is irradiated to the light reflecting surface 241.

In the relationship between the light emitting element 220 and the light reflecting member 240 corresponding to each other, the light emitting element 220 is located farther from the point of symmetry than the light reflecting member 240. Thus, light emitted from the light emitting element 220 travels in a direction approaching the point of symmetry.

The light emitting elements 220, the protective element 250, and the temperature measuring element 260 are electrically connected to each of the metal films disposed on the upward-facing surface 210e of the base portion 210 via corresponding wires 270. The metal film provided on the upward-facing surface 210e of the base portion 210 is used for electrical connection between these elements and an external power source. As a result, these elements and the external power supply can be electrically connected via the metal film on the upward-facing surface 210e of the base portion 210.

The plate-shaped member 21 of the optical member 20 is disposed on the upper surface side of the base portion 210. More specifically, an outer peripheral portion of the lower surface 21b of the plate-shaped member 21 is bonded to the upper surface of the stepped portion 216 of the base portion 210. The plate-shaped member 21 is bonded to the base portion 210, which forms a closed space in which the light emitting elements 220 are disposed is formed. In this manner, in the light emitting device 200, the plate-shaped member 21 can serve as a lid member. This closed space is in a hermetically sealed state. Hermetic sealing allows for reducing attraction of dust such as organic substances on the light emitting end surface of the light emitting element 220.

When the light-transmissive member 10 is used in place of the optical member 20, for example, the light reflecting portion 12 of the light-transmissive member 10 may have an appropriate size, and an outer peripheral portion of the lower surface 12b of the light reflecting portion 12 may be bonded to the upper surface of the stepped portion 216 of the base portion 210.

The main portion of the light emitted by the light emitting element 220 is reflected at the light reflecting surface 241 of the light reflecting member 240 and is incident on the plate-shaped member 21. The plate-shaped member 21 is transmissive of light emitted by the light emitting element 220. The main portion of the light passes through the plate-shaped member 21 and then enters the light transmitting portion 11 of the light-transmissive member 10 included in the optical member 20.

The light-transmissive member 10 has a light incident region on which the main portion of light is incident and a peripheral region thereof on the lower surface of the light-transmissive member 10. In the light-transmissive member 10, the light transmitting portion 11 forms the light incident region. In the light-transmissive member 10, when the light transmitting portion 11 is a wavelength conversion portion containing a phosphor, the light transmitting portion 11 emits a second light having a different wavelength converted from a first light emitted from the light emitting element 220.

The first light emitted from the light emitting element 220 or the second light that is wavelength-converted in the light transmitting portion 11 is emitted to the outside of the light emitting device 200 via the metal region 15 formed on the upper surface 11a of the light transmitting portion 11. In other words, the upper surface of the metal region 15 formed on the upper surface 11a of the light transmitting portion 11 serves as the emission surface of the light emitting device 200. In the light-transmissive member 10, when the light transmitting portion 11 is a wavelength conversion portion containing a phosphor, the metal region 15 allows the emitting amount of the first light to be smaller than that in a state in which the metal region 15 is absent, and allows the emitting amount of the second light to be greater than that in the state in which the metal region 15 is absent.

The light shielding member 280 is disposed inward of the frame formed by the upper surface 210a of the base portion 210. The light shielding member 280 is disposed to fill a gap between the base portion 210 and the light-transmissive member 10. The light shielding member 280 can be formed by, for example, pouring a thermosetting resin and curing the poured resin with heat. With the light shielding member 280, leakage of light can be reduced.

In the light emitting device 200, for example, the light transmitting portion 11 of the light-transmissive member 10 may contain a YAG phosphor, and the light emitting element 220 may be a semiconductor laser element configured to emit blue light having an emission peak wavelength in a range of 420 nm to 480 nm.

The light emitting device 200 includes the light-transmissive member 10 including the metal region 15 having the transmittance bottom wavelength in a specific wavelength range to absorb light in the specific wavelength range that has reached the metal region 15.

Therefore, the chromaticity point of light emitted from the light emitting device 200 can be adjusted. For example, when the metal region 15 mainly absorbs light in a wavelength range of 500 nm to 600 nm (green component) included in incident light, the green component of fluorescence by the YAG phosphor is mainly reduced, and relatively reddish light is emitted from the light emitting device 200. Thus, light having a predetermined wavelength is absorbed without significantly impairing the overall light-transmittance, so that light adjusted to a desired chromaticity can be emitted.

The light emitting device 200 can be used, for example, for an on-vehicle headlight. The light emitting device 200 can also be used for illumination, a projector, a head-mounted display, and a light source such as a backlight of other displays.

Although certain embodiments and the like have been described in detail above, the present invention is not limited to the above-described embodiments and the like. Various modifications and substitutions can be made to the above-described embodiments and the like without departing from the scope described in the claims.

What is claimed is:

1. A light-transmissive member comprising:
   a light transmitting portion having a first surface and a second surface, wherein the light transmitting portion is configured to receive light at the first surface, transmit at least a portion of the received light to the second surface, and emit at least a portion of the transmitted light from the second surface, and wherein the second surface of the light transmitting portion is planar; and
   a metal region on the second surface, wherein the metal region comprises either (i) a metal film having a thickness in a range of 1 nm to 10 nm, or (ii) dispersed metal particles each having a maximum length in a direction perpendicular to the second surface in a range of 1 nm to 100 nm.

2. The light-transmissive member according to claim 1, wherein: the metal region is formed on the second surface and is not formed on the first surface.

3. The light-transmissive member according to claim 1, wherein the first surface of the light transmitting portion is a surface opposite to the second surface of the light transmitting portion.

4. The light-transmissive member according to claim 1, wherein:
   the light transmitting portion is transmissive to light in a wavelength range of 400 nm to 760 nm, and
   the light transmitting portion on which the metal region is formed allows a ratio of light in a wavelength range of 500 nm to 600 nm to an entirety of the light in the wavelength range of 400 nm to 760 nm to be smaller than in a case in which light in a wavelength range at least from 500 nm to 600 nm passes through the light transmitting portion on which the metal region is absent.

5. The light-transmissive member according to claim 1, wherein the metal region is formed of gold.

6. The light-transmissive member according to claim 1, wherein:
   the light transmitting portion contains a phosphor, and the phosphor is yttrium aluminum garnet activated with cerium.

7. The light-transmissive member according to claim 6, wherein the metal region comprises the dispersed metal particles, and each of the dispersed metal particles has a maximum length in the direction perpendicular to the second surface in a range of 40 nm to 60 nm.

8. The light-transmissive member according to claim 1, further comprising a light-transmissive protective film covering the metal region.

9. The light-transmissive member according to claim 8, wherein a thickness of the protective film is greater than the thickness of the metal region or the maximum length of each of the metal particles in the direction perpendicular to the second surface.

10. The light-transmissive member according to claim 8, wherein the protective film is a silicon oxide film.

11. An optical member comprising:
    the light-transmissive member according to claim 1; and
    a light-transmissive plate-shaped member disposed on a first surface side of the light transmitting portion.

12. A light emitting device comprising:
    a light emitting element; and
    the optical member according to claim 11, wherein:
    the light-transmissive member allows light emitted from the light emitting element to pass through the light transmitting portion and the metal region provided on the second surface.

13. A light emitting device comprising:
    a light emitting element; and
    the light-transmissive member according to claim 1, wherein:
    the light-transmissive member allows light emitted from the light emitting element to pass through the light transmitting portion and the metal region provided on the second surface.

14. The light emitting device according to claim 13, wherein the light emitting element has a light emission peak wavelength in a range of 320 nm to 495 nm.

15. The light emitting device of claim 13, wherein the metal region absorbs a portion of the light passing through the metal region, such that a linear transmittance of the metal region is lower than a linear transmittance of the light transmissive portion.

* * * * *